United States Patent
Lebby et al.

(10) Patent No.: US 7,821,066 B2
(45) Date of Patent: Oct. 26, 2010

(54) MULTILAYERED BOX IN FDSOI MOSFETS

(76) Inventors: Michael Lebby, 30 N. La Barge Rd., Apache Junction, AZ (US) 85219; Vijit Sabnis, 2220 Homestead Ct., Apt. 113, Los Altos, CA (US) 94024; Petar B. Atanackovic, 1050 Waverley St., Palo Alto, CA (US) 94301

( * ) Notice: Subject to any disclaimer, the term of this patent is extended or adjusted under 35 U.S.C. 154(b) by 244 days.

(21) Appl. No.: 11/635,895

(22) Filed: Dec. 8, 2006

(65) Prior Publication Data

US 2008/0135924 A1    Jun. 12, 2008

(51) Int. Cl.
*H01L 27/01* (2006.01)
*H01L 27/12* (2006.01)
*H01L 31/0392* (2006.01)

(52) U.S. Cl. .................. 257/347; 257/348; 257/349; 257/E27.112

(58) Field of Classification Search ............ 257/347, 257/348, 349, E21.32, E27.112
See application file for complete search history.

(56) References Cited

U.S. PATENT DOCUMENTS

| 7,037,806 | B1 * | 5/2006 | Atanackovic | 438/458 |
| 7,446,350 | B2 * | 11/2008 | Chen et al. | 257/190 |
| 2004/0129975 | A1 * | 7/2004 | Koh et al. | 257/347 |
| 2005/0045949 | A1 * | 3/2005 | Lin et al. | 257/347 |
| 2007/0069300 | A1 * | 3/2007 | Cheng et al. | 257/368 |
| 2007/0080402 | A1 * | 4/2007 | Kato | 257/351 |
| 2007/0166948 | A1 * | 7/2007 | Vo | 438/406 |

\* cited by examiner

*Primary Examiner*—Shouxiang Hu
(74) *Attorney, Agent, or Firm*—Parsons & Goltry; Robert A. Parsons; Michael W. Goltry

(57) ABSTRACT

A fully depleted MOSFET has a semiconductor-on-insulator substrate that includes a substrate material, a BOX positioned on the substrate material, and an active layer positioned on the BOX. The BOX includes a first layer of material with a first dielectric constant and a first thickness and a second layer of material having a second dielectric constant different than the first dielectric constant and a second thickness different than the first thickness. The first layer of material is positioned adjacent the substrate material and the second layer of material is positioned adjacent the active layer. Drain and source regions are formed in the active layer so as to be fully depleted. The drain and source regions are separated by a channel region in the active layer. A gate insulating layer overlies the channel region and a gate stack is positioned on the gate insulating region. It is anticipated that the structure is most useful for channel regions less than 90 nm long.

5 Claims, 24 Drawing Sheets

Short Channel Thin BOX
FDSOI with ground plane (GP)

Figure 5B: Long Channel FDSOI

Figure 5A: Short Channel FDSOI

Figure 6A: Short Channel Thin BOX FDSOI

Figure 6B: Short Channel Thick BOX FDSOI

Figure 12B: Short Channel Thin BOX FDSOI with ground plane (GP)

Figure 12A: Short Channel Thin BOX FDSOI

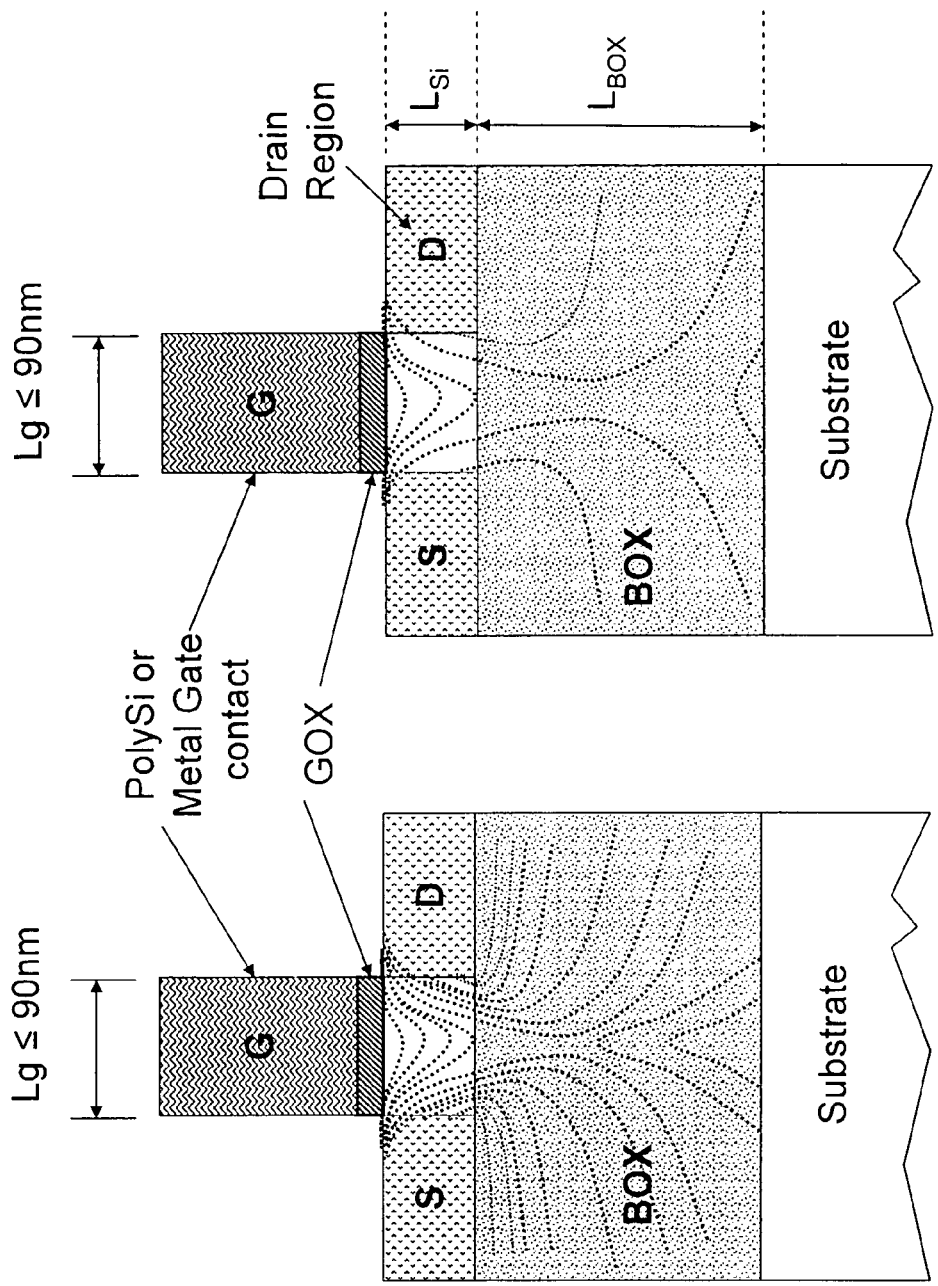

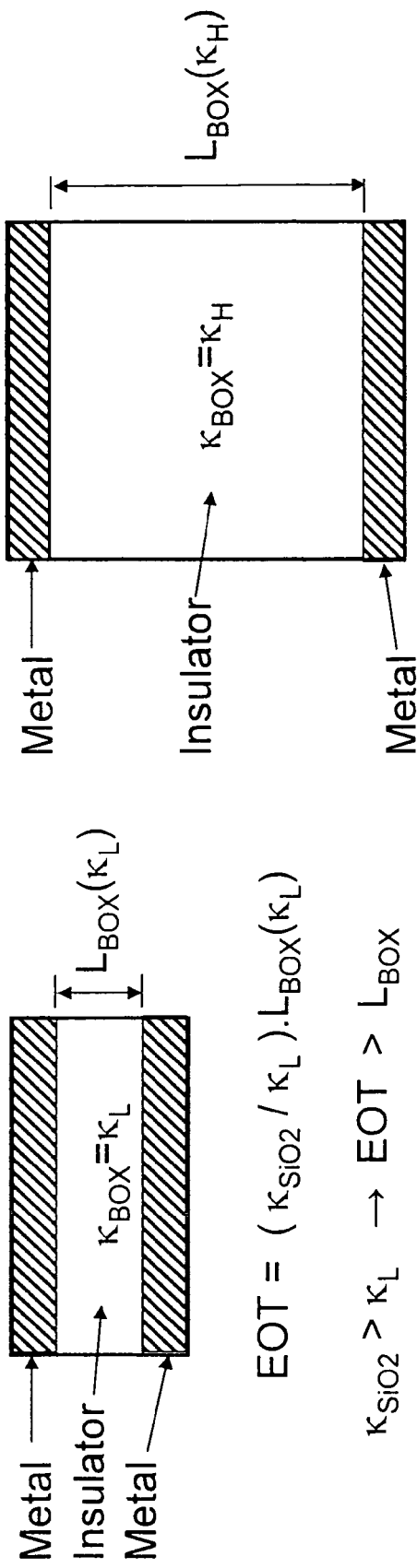
Figure 16A: EOT using low-κ dielectric, referenced to SiO$_2$, $\kappa_L < \kappa_{SiO2}$.
Figure 16B: EOT using high-κ dielectric, referenced to SiO$_2$, $\kappa_H > \kappa_{SiO2}$.

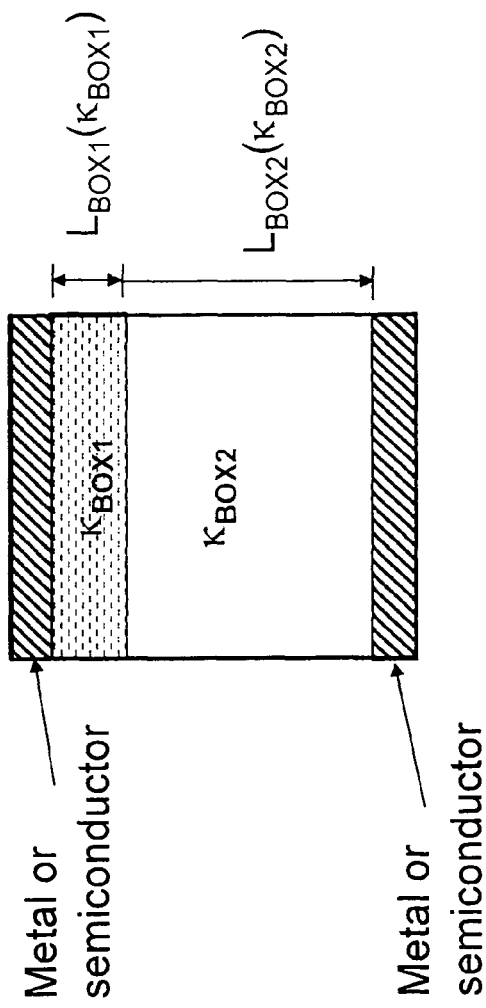
Figure 17: EOT using stacked low-κ and high-κ dielectric BOX, referenced to SiO$_2$.

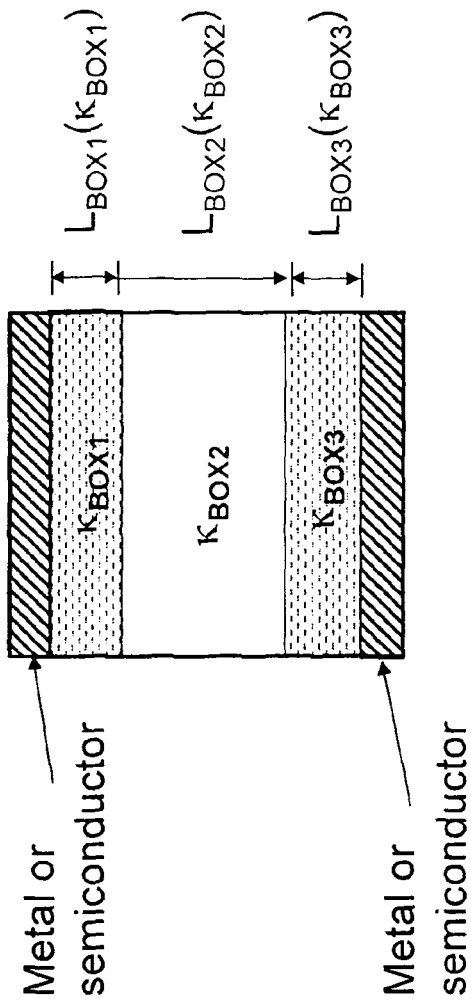
$$EOT = (\kappa_{SiO2}/\kappa_L).L_{BOX1}(\kappa_L) + (\kappa_{SiO2}/\kappa_H).L_{BOX2}(\kappa_H) + (\kappa_{SiO2}/\kappa_L).L_{BOX3}(\kappa_L)$$
$$(\kappa_{BOX1}, \kappa_{BOX3}=\kappa_L) < \kappa_{SiO2} < (\kappa_{BOX2}=\kappa_H)$$
*i.e.*, $\kappa_L < \kappa_{SiO2} < \kappa_H$
Figure 18: EOT using multilayer stacked low-κ / high-κ / low-κ dielectric, referenced to $SiO_2$.

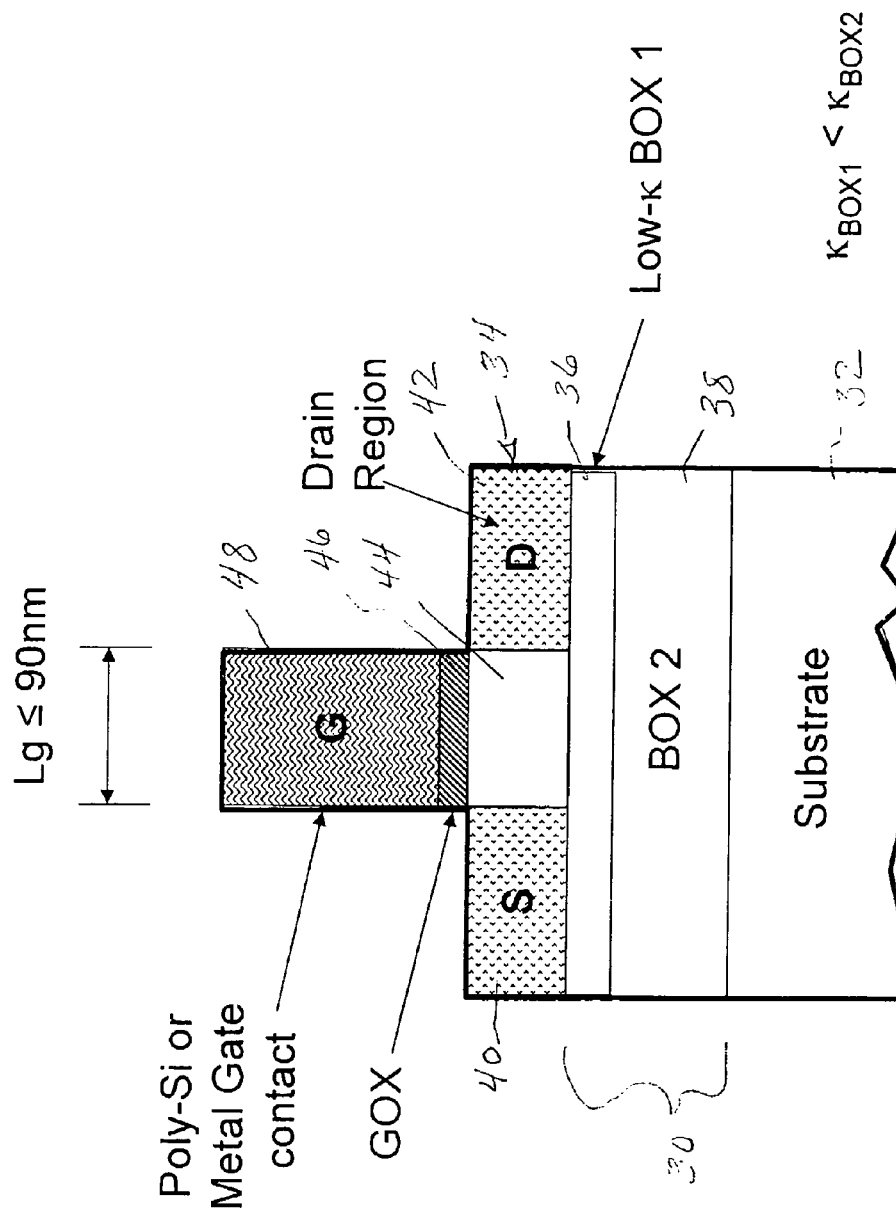
Figure 19: Short Channel Thin BOX FDSOI with ground plane (GP)

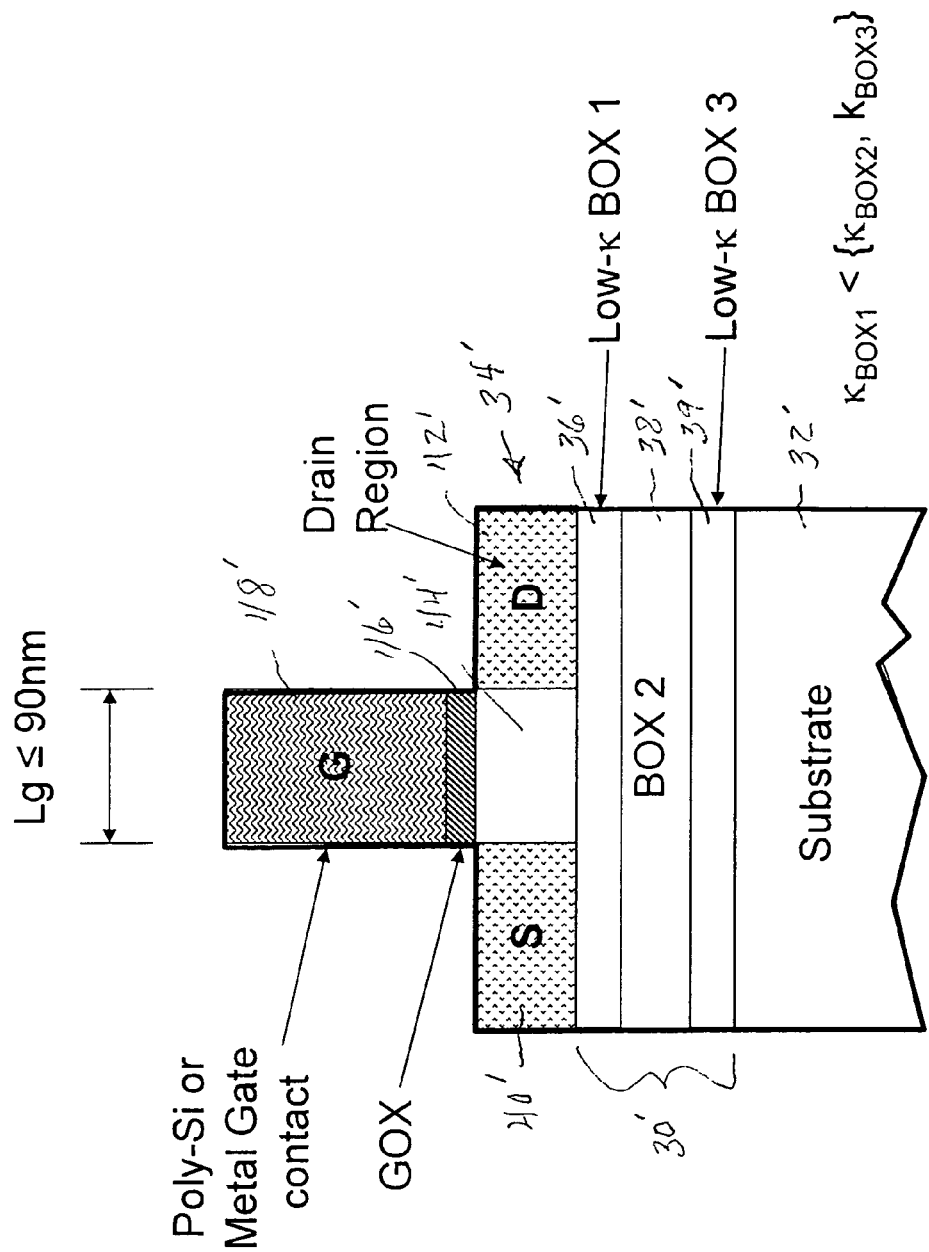
Figure 20: Short Channel Thin BOX FDSOI with ground plane (GP)

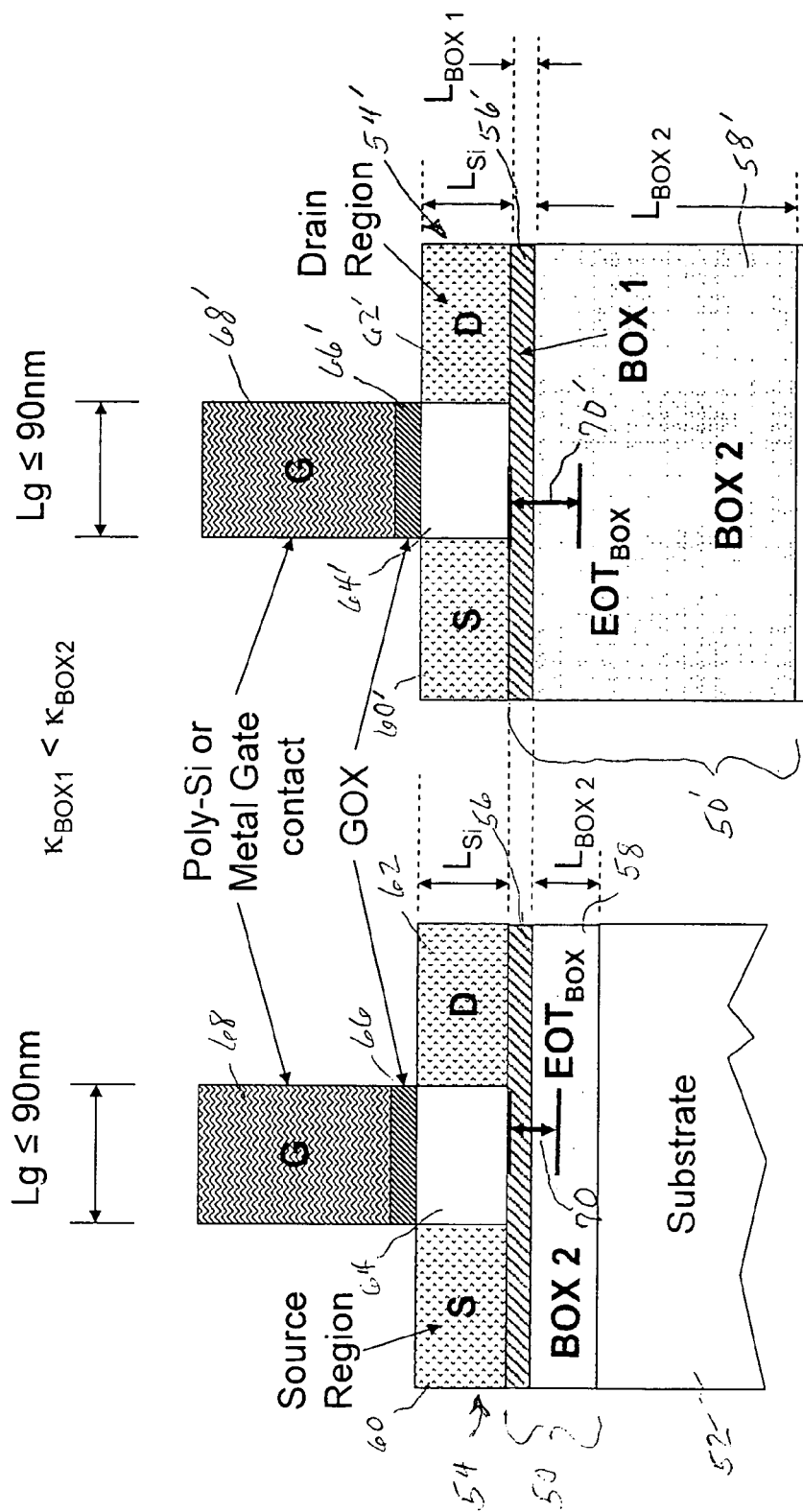
Figure 21A: Short Channel Thin BOX FDSOI
Figure 21B: Short Channel Thick BOX FDSOI

Low-κ Materials

| Low-κ material class | κ | Comment | Low-κ SOI process |
|---|---|---|---|
| Silicon Dioxide | 3.9 | dd | Implant, Wafer-Bond |
| Flourinated Silicate Glass | 3.1-3.6 | | Implant, Wafer-Bond, CVD,PECVD, HDP-CVD, ALD |
| Silsesquioxane | 2.5-3.0 | | CVD, Wafer-Bond, ALD, MOCVD |
| Poly(Arylene Ether) | 2.6-2.9 | | Spin-on, Wafer-Bond |
| Parylene | 2.2-3.0 | | Spin-on, Wafer-Bond, cvd |
| Flouropolymer | 1.9-2.1 | | Spin-on, Wafer-Bond |
| Flourinated Amorphous Carbon | 2.0-2.6 | | Implant, Wafer-Bond, CVD |
| Diamond-like Carbon | 2.4-2.9 | | CVD, Implant, Wafer-Bond |
| Porous and Mesoporous {Silica, Polyimide, Polyarylene ether, Silsesquioxane} | 1.2-2.4 | | Wafer-Bond, Spin-on, CVD, Anodic, Etch, |
| Air Gap | 1.0 | | Implant, Wafer-Bond, Etch, Selective Epitaxy/Etch, Oxidation |
| Rare-Earth-Silicate | 4-10 | | Implant, Wafer-Bond, Epitaxy, CVD, MOCVD, MBE, ALE, ALD |

Figure 22

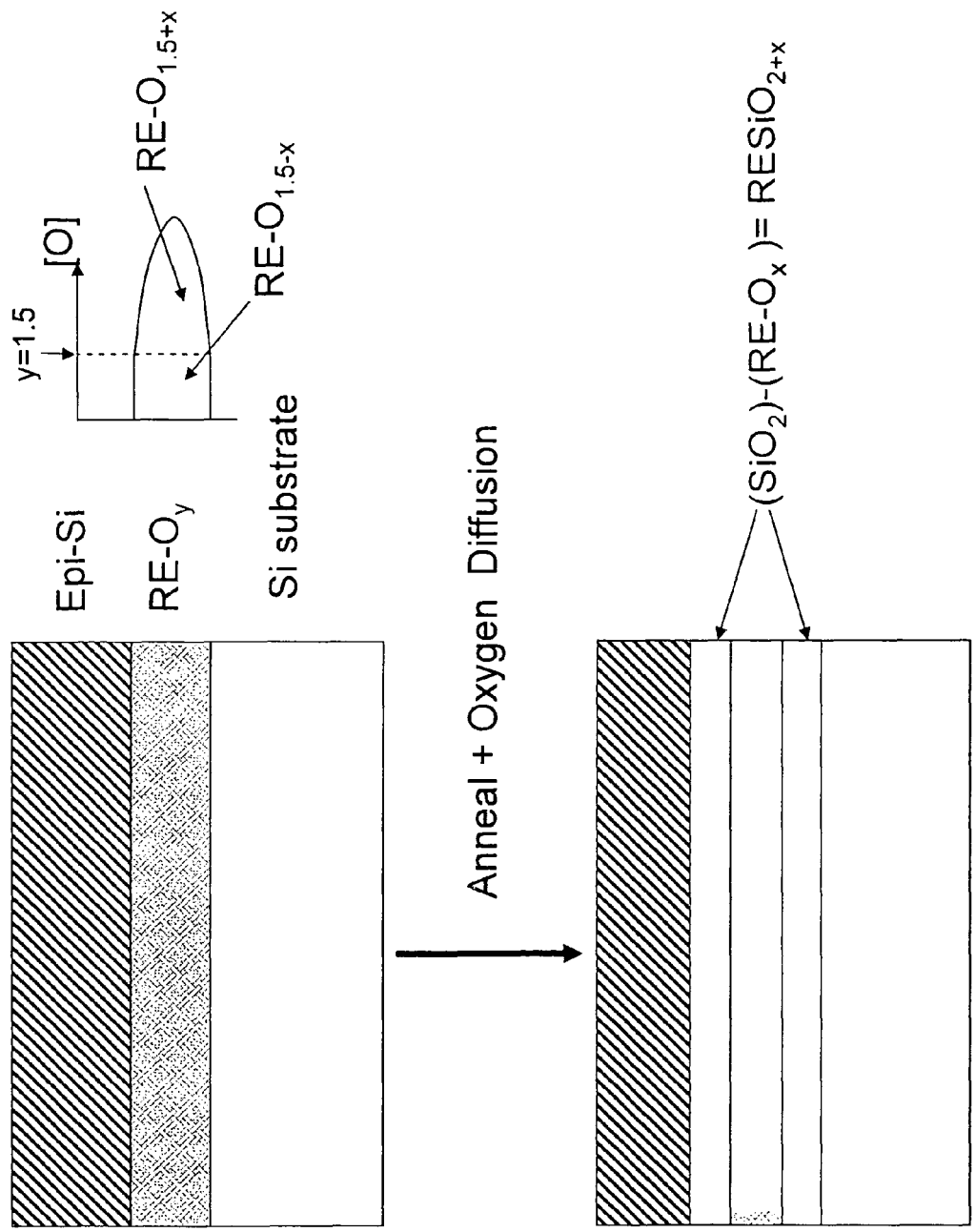
Figure 23: Epitaxial low-κ FDSOI

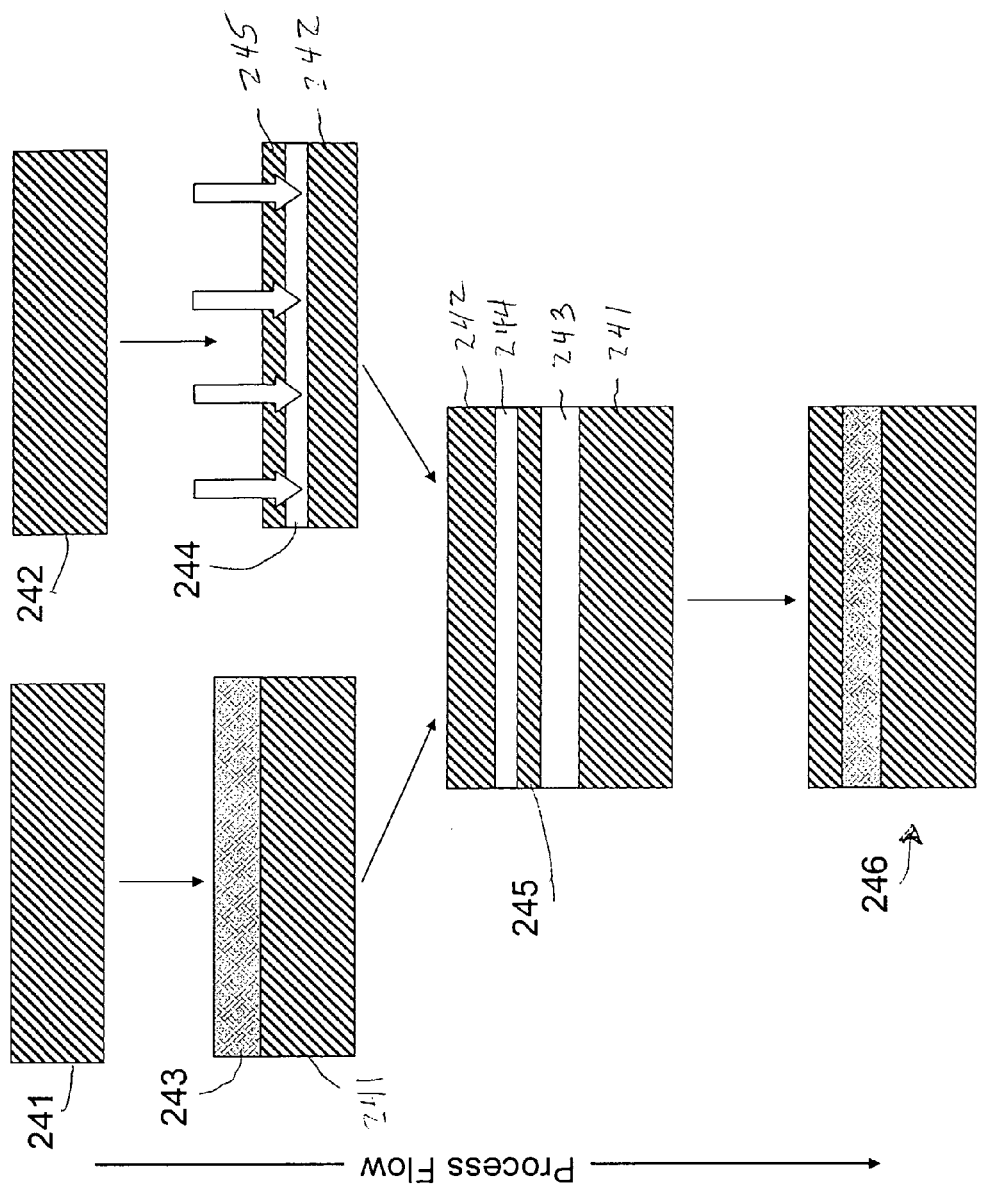
Figure 24: Wafer Bond low-k FDSOI

MULTILAYERED BOX IN FDSOI MOSFETS

FIELD OF THE INVENTION

This invention relates in general to analog and digital devices operating at multi-gigahertz frequencies and/or nanometer length scale dimensions and to methods of fabrication.

The present disclosure relates to optimal design criteria and method of fabrication of analog and digital devices based on semiconductor-on-insulator (SOI) multilayered structures. In particular, electronic devices such as planar field-effect-transistors (FETs) utilizing fully-depleted semiconductor-on-insulator (FDSOI) substrates are specifically chosen as an example utility of the present structure. Direct application of the present structure is disclosed for planar single gate FDSOI FETs approaching the 45 nm technology node and below.

BACKGROUND OF THE INVENTION

Present silicon (Si) nanometer (nm) scale electronic devices are constructed using planar FET topologies. The FET control gate is composed of a gate dielectric (usually an oxide and thus termed a 'gate-oxide') and is typically composed of silicon dioxide ($SiO_2$) or silicon oxy-nitride ($SiO_xN_y$) dielectric materials disposed upon a single crystal silicon active layer and/or substrate. Modern logic design is based on complementary-metal-oxide-semiconductors (CMOS) employing charge carrier transport exhibiting both n-type and p-type CMOSFETs and are characterized by transistor feature sizes in ranges of 130 nm, 90 nm, 65 nm, 45 nm, 32 nm, and ultimately approaching 20 nm. Referring to FIG. 1, a graph is illustrated showing the actual and projected CMOSFET length scale and gate length (Lg) required as a function of technology generation (technology node) and year. As the planar transistor geometry shrinks in accordance with new fabrication generations or technology nodes, all the CMOSFET dimensions must scale. For example, the gate oxide thickness and gate length must also be reduced (or scaled) in accordance with well known scaling rules. The primary advantage of CMOS logic gates is the logic elements (composed of many nMOS and pMOS transistors) only draw significant current between logic state transitions, thereby allowing power consumption to be greatly minimized due to negligible dissipation in the off-state. This is clearly an advantage for high densities of logic elements in ultra-large-scale integrated circuits (ULSICs), such as, microprocessors and mobile and/or portable devices.

Projected performance gains of 30% per technology generation have been targeted at increasing CMOSFET density and circuit function per unit area. An added benefit of reduced feature scaling is that increased MOSFET device and overall circuit speed occurs. Ideal device performance has been relaxed due to deficiencies in materials and manufacturing methods available, resulting in CMOSFET sub-threshold leakage current increasing continuously from several nanoamperes per micrometer (nA/μm) at the 130 nm technology node, to currently hundreds of nA/μm at the 65 nm technology node. This leakage represents approximately two orders of magnitude increase in leakage power.

There are two types of leakage power in ULSICs: active leakage power and standby leakage power. Active leakage power is defined as leakage power consumed by a nanoscale CMOS system while doing useful work and standby leakage power is leakage power consumed when the system is idle.

The 90 nm technology node has seen leakage power increase to as much as 40% of the total on-chip power consumed. The waste heat and/or power dissipation situation degrades further with reduced CMOSFET length scaling to 65 nm and below. The leakage currents ultimately manifest as heat in ULSICs with large waste heat power densities and will soon exceed on-chip and off-chip conventional thermal management systems. Such large thermal loads result in reduced system reliability and place limits on the battery lifetime of portable devices. Ultimately, the thermal problem due to leakage currents places hard thermodynamic limits on further CMOSFET feature size reduction, circuit density and increased frequency of operation.

The leakage currents in planar single gate CMOSFETs can be generally classed as leakage substantially through the control gate oxide insulator and leakage between the channel layer and the substrate.

Sub-90 nm CMOSFET channel length scaling requires conventional gate oxide insulator thickness ($L_{GOX}$) to approach only a few atomic layers. Such small physical thickness of $L_{GOX}$ is causing a failing of the ideal insulator action of the gate oxide due to quantum mechanical tunneling processes. This gate oxide tunneling current adversely affects the off-state and on-state leakage and the mobility of the fundamental carriers, electrons (nMOS) and holes (pMOS). Unfortunately, replacing the gate oxide with an ideal higher dielectric constant (i.e., high-κ) material in order to satisfy the equivalent gate oxide thickness ($EOT_{GOX}$) required along with high reliability and fabrication compatibility has not yet eventuated despite much effort and research over the past decade.

Efforts to reduce channel to substrate leakage concentrated on implementing partially depleted semiconductor-on-insulator (PDSOI) substrates. Historically, PDSOI is used as a solution to reduce device leakage currents and substrate capacitance. Unfortunately, the early advantage of reduced capacitive coupling of the channel to the substrate using PDSOI when incorporated in long gate length devices above the 90 nm technology node has been superseded by more challenging factors for short channel CMOSFET dimensions below the 65 nm technology node.

Scaling below the 65 nm technology node imposes many new constraints on device topology. In order to retain the fundamental electrostatic operation of the CMOSFET devices below the 65 nm technology node, the use of fully-depleted semiconductor-on-insulator (FDSOI) substrates are necessary. Optimal FDSOI design relies on an understanding of the unique performance advantages provided by both the ultrathin semiconductor active layer (or body) and the buried insulator layer. Conventional semiconductor-on-insulator substrates use silicon-on-insulator (SOI) structure.

Classical bulk-Si and PDSOI CMOS scaling beyond a physical gate length of ~50 nm will probably no longer be valid due to severe short channel effects (SCEs) and unacceptably low ratios between on and off currents ($I_{on}/I_{off}$). This is the primary reason for introducing single gate (SG) FDSOI devices initially at 65 nm. Toward the 32 nm technology node, or approximately thereat, planar and/or vertical double gate (DG) FDSOI devices are required to preserve FET electrical integrity. Key issues effecting planar single gate FDSOI are the introduction of high-κ gate oxides, gate contacts (e.g., metal gates), FDSOI physical structure and manufacturability, source and drain contact resistance, and channel mobility.

One advantage not commonly remarked upon is the fact that SG FDSOI potentially simplifies the ULSIC front-end-of-line (FEOL) process and potentially the cost of manufacture. That is, bulk-Si and PDSOI CMOS typically use twin-wells to define the body of either the pMOS (using an n-well) and nMOS (using a p-well) because the substrate has a fixed conductive type. The gate threshold voltage can be adjusted via a n-doped (or p-doped) poly-Si gate contact stacked onto the gate oxide for n-MOS (or PMOS). P-type (or n-type) source and drain implants are used to realize p-MOS (or n-MOS) devices. It is well known by artisans in the field, the following FEOL steps are essential to the formation of the dual well CMOSFET process. First, a deep doping peak is formed using ion implantation techniques, so as to aid in the: (i) suppression of transistor latch-up; (ii) reduce charge pairs generated from radiation effects; and (iii) provide part of the electrostatic discharge protection path. The next critical FEOL step forms a shallow doping peak located just below the bottom of the shallow trench isolation regions separating FET devices. This step suppresses lateral leakage between adjacent transistors within the wells (intra-well leakage) and between adjacent transistors at the well boundaries (inter-well leakage). The next critical step forms another very shallow doping peak at the silicon surface and is used to set the threshold voltage $V_{th}$ of the transistors. These steps are common to both bulk and PDSOI CMOSFETs.

The opportunity for fabrication process simplification using FDSOI mainly occurs in the three preceding steps outlined above. The use of FDSOI wafers eliminates the need for the high-energy ion implantation process that forms the deep n-type and p-type twin wells and the field channel stop isolation regions. This translates directly into fewer photolithographic masks and ion implantation steps, made possible by the elimination of well and field isolation implants.

CMOS transistors designed for use with SOI wafers are classified by thickness (designated $L_{Si}$) of the device-quality single-crystal silicon layer at the surface of and extending above the buried oxide (BOX) insulator layer. The BOX layer is disposed upon a substrate, typically also composed of single crystal silicon. An SOI CMOS transistor is classified as partially depleted (PD) if the silicon surface layer is thicker than the depth of the depletion region (designated $L_{Depl}$) in the transistor channel, i.e., $L_{Depl} < L_{Si}$. The SOI CMOS is classified as fully depleted (FD) if the silicon surface layer is equal to the depth of the depletion region in the transistor channel, i.e., $L_{Depl} = L_{Si}$. Examples of short channel and long channel FDSOI CMOSFET are illustrated in FIGS. 2A and 2B, respectively. The transistor will be partially depleted or fully depleted depending on the silicon layer thickness above the BOX and the doping concentration in the channel, designated $N_{ch}$.

To form a FDSOI transistor, $N_{ch}$ must be low enough so that the gate depletion region extends throughout the entire thickness of the silicon active layer. When the silicon surface layer in the SOI CMOS is thicker than about 50 nm ($L_{Si} > 50$ nm), the transistor will typically be partially depleted, unless $N_{ch}$ is reduced to such low values that $V_{th}$ is too low for practical CMOS applications. If the silicon layer thickness is reduced to $L_{Si} < 50$ nm, the transistor will be fully depleted, even when $N_{ch}$ is increased to produce $V_{th}$ considerably higher than bulk and PDSOI devices. If the silicon layer thickness is reduced further toward and below $L_{Si} < 20$ nm, the transistor will remain fully depleted even if $N_{ch}$ is increased considerably to produce even higher threshold voltages (e.g., $V_{th} \sim 700$ mV).

Significant advantages exist for FDSOI transistors over PDSOI transistors, and the trend in SOI CMOS beyond 90 nm is toward the use of FD devices. A fundamental advantage in FDSOI CMOSFETs, is the parameter known as the subthreshold slope (SS), which can attain values that can be very low compared with bulk Si and PDSOI CMOSFETs. Typically, in FDSOI, a relatively small gate voltage, on the order of ~50 mV increase, will result in a large, tenfold increase, in the subthreshold drain current. This allows $V_{th}$ of the FDSOI CMOS device to be very low and to result in acceptable subthreshold leakage or off-state current ($I_{off}$). The low $I_{off}$ determines the off-state power dissipation. Lowering $V_{th}$ allows the supply voltage ($V_s$) to also be reduced significantly without degrading CMOS IC speed performance. This is a fundamental property of FET scaling. A general rule of thumb requires $V_s$ to be greater or equal to $5V_{th}$. Typically, for $V_s < 5V_{th}$ the speed performance of the circuit will degrade rapidly. The reduction of $V_s$ produces a significant reduction in active power dissipation, without high performance degradation. Note, the active power dissipation is further reduced by reduction of parasitic capacitance in SOI CMOS relative to bulk CMOS.

In general, PDSOI CMOSFETs suffer problematic floating body effects, which is less of a problem in FDSOI transistors. Consequently, it is expected that FDSOI CMOS transistors will be generally adopted in the near future. Converting an existing PDSOI CMOS device and circuit design into FDSOI CMOS is expected to be straightforward, at least in comparison with the challenges in the conversion from bulk CMOS to SOI CMOS.

Using FDSOI devices, the short-channel effect is primarily controlled by the thickness of the silicon film ($L_{Si}$), generally, the thinner the film, the better the control. Less than 20 nm of silicon should be used at the 90 nm technology node and less than 15 nm of silicon should be used at the 65 nm technology node for planar single-gate fully depleted transistors. Toward the end of the technology roadmap represented by the 20 nm technology node, only $L_{Si} \sim 5$ nm is required. This represents significant manufacturing hurdles using conventional separation by implantation of oxygen (SIMOX) and wafer bonding techniques. Direct epitaxial techniques may provide significant advantages to SOI structure flexibility, uniformity and cost.

The electrostatic integrity (EI) advantage of single gate planar FDSOI MOSFETs compared to bulk Si MOSFETs is well known. FIG. 3 shows how the dimensionless figure of merit EI of planar single gate bulk Si, planar single gate FDSOI and double gate FDSOI MOSFETs scale as a function of the technology node. The required $L_{Si}$ for SG and DG FDSOI MOSFETs is also shown on the left hand axis of FIG. 3 as a function of the technology node.

Clearly, with reference to EI performance, the advantage of the SG FDSOI device is that it has substantially lower value of EI compared to bulk-Si for all technology nodes. Bulk-Si exhibits an unacceptably high value of EI (EI~0.14) approaching and beyond the 65 nm technology node. The EI of SG FDSOI at the 45 nm technology node becomes equivalent to bulk-Si at the 65 nm technology node. SG and DG FDSOI structures are required to have ultra-thin Si body layer thickness in the range of 4 nm $\leq L_{Si} \leq 25$ nm, the mid to lower bound approaching the 20 nm technology node exhibiting quantum confinement effects. In prior art, $L_{Si}$ has typically been treated with the design parameters of the buried oxide (BOX) insulating layer as semi-infinite in extent. That is, the BOX layer has typically remained unchanged in the thick layer regime, $L_{BOX} > 50\text{-}100$ nm. The BOX layer is typically thick ($t_{Box} \leq 50\text{-}100$ nm) so that the channel to BOX capacitance ($C_{BOX}$) is kept small relative to the gate oxide capacitance ($C_{GOX}$), such that $C_{BOX} \ll C_{GOX}$. The trade-off between the short-channel effect, drain-induced barrier lowering and $C_{BOX}$ by varying the BOX layer thickness ($t_{Box}$) and dielectric constant have not been investigated in depth.

Furthermore, for FDSOI substrates both the Si and BOX layers have a roadblock for manufacture using prior art techniques approaching 2011, with 15 nm≦$L_{Si}$≦28 nm and 26 nm≦$L_{BOX}$≦44 nm {itrs}. Thickness non-uniformity in both the Si and BOX layers is an important parameter for guarantee of MOSFET performance across a wafer. Therefore, techniques that allow relaxation of design manufacture tolerances are necessary to reduce cost and increase yield.

It would be highly advantageous, therefore, to remedy the foregoing and other deficiencies inherent in the prior art.

Accordingly, it is an object of the present invention to provide new and improved methods and apparatus for controlling short channel effects, leakage, and threshold effects of FDSOI MOSFETs including various combinations and positions of multilayer thin BOX, low-κ designs, and high-κ designs.

An aspect of the present invention is to disclose methodology for controlling short channel effects and/or leakage and/or threshold effects of FDSOI MOSFETs advantageously using multilayer thin BOX and/or low-κ designs.

Another aspect of the present invention is to disclose methodology for controlling short channel effects and/or leakage and/or threshold effects of FDSOI MOSFETs advantageously using multilayer thin BOX and a combination of low-κ and high-κ designs.

A further aspect of the present invention is to disclose methodology for controlling short channel effects and/or leakage and/or threshold effects of FDSOI MOSFETs advantageously using multilayer thin BOX and/or low-κ designs with a conducting layer or layers disposed between the BOX layers and the substrate.

SUMMARY OF THE INVENTION

Briefly, to achieve the desired objects and aspects of the instant invention in accordance with a preferred embodiment thereof, provided is an SOI structure including substrate material, a BOX positioned on the substrate material, and an active layer positioned on the BOX. The BOX includes a first layer of material with a first dielectric constant and a first thickness and a second layer of material having a second dielectric constant different than the first dielectric constant and a second thickness different than the first thickness. The first layer of material is positioned adjacent the substrate material and the second layer of material is positioned adjacent the active layer. In the preferred embodiment, the first layer of material has a dielectric constant lower than the dielectric constant of $SiO_2$.

In another embodiment in accordance with the present invention an SOI structure includes substrate material, a BOX positioned on the substrate material, and an active layer positioned on the BOX. The BOX includes a first layer of material with a first dielectric constant and a first thickness, a second layer of material having a second dielectric constant different than the first dielectric constant and a second thickness different than the first thickness, and a third layer of material having a third dielectric constant different than the second dielectric constant and a third thickness different than the second thickness. The first layer of material is positioned adjacent the single crystal substrate material, the third layer of material is positioned adjacent the active layer, and the second layer of material is sandwiched between the first layer of material and the second layer of material. In a preferred embodiment of this structure, the first layer of material has a dielectric constant lower than the dielectric constant of $SiO_2$ and the second layer of material has a dielectric constant higher than the dielectric constant of $SiO_2$.

The desired objects and aspects of the instant invention are further realized in accordance with a method of manufacturing a short channel fully depleted device on an SOI structure. The method increases performance of the manufactured devices and alleviate manufacturing tolerances to simplify manufacturing processes. Generally, the method includes the steps of providing a substrate, forming a BOX in the substrate with an active layer on the BOX, and adjusting the dielectric constant of at least a portion of the BOX to be lower than the dielectric constant of $SiO_2$ so as to reduce the subthreshold slope and the drain-induced-barrier-lowering effect associated with the BOX.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 15A illustrates electric field fringing for short channel FDSOI device using high-κ BOX layer;

FIG. 15B illustrates electric field fringing for short channel FDSOI device using low-κ BOX layer;

FIG. 16A illustrates the equivalent oxide thickness (EOT) of a capacitor structure using low-κ dielectric material, referenced to $SiO_2$;

FIG. 16B illustrates the equivalent oxide thickness (EOT) of a capacitor structure using a high-κ dielectric layer, referenced to $SiO_2$;

FIG. 17 illustrates the equivalent oxide thickness (EOT) of a capacitor structure using a multilayered BOX structure (stacked) including high-κ and low-κ dielectric layers, referenced to $SiO_2$;

FIG. 18 illustrate the equivalent oxide thickness (EOT) of another embodiment of a capacitor structure using a multilayered BOX structure (stacked) including high-κ and low-κ dielectric layers, referenced to $SiO_2$;

FIG. 19 illustrates an embodiment of a short channel FDSOI device using a multilayered BOX including high-κ and low-κ dielectric layers in accordance with the present invention;

FIG. 20 illustrates another embodiment of a short channel FDSOI device using a multilayered BOX including high-κ and low-κ dielectric layers in accordance with the present invention;

FIG. 21A illustrates another embodiment of a short channel FDSOI device using a thin multilayered BOX including high-κ and low-κ dielectric layers in accordance with the present invention;

FIG. 21B illustrates another embodiment of a short channel FDSOI device using a thick multilayered BOX including high-κ and low-κ dielectric layers in accordance with the present invention;

FIG. 22 is a table of known low dielectric materials relative to $SiO_2$;

FIG. 23 illustrates an epitaxial process for fabricating short channel low-κ BOX FDSOI CMOSFETs; and FIG. 24 illustrates a process using wafer bonding for fabricating a low-κ BOX region suitable for use in FDSOI CMOSFETs.

DETAILED DESCRIPTION OF THE DRAWINGS

The present invention discloses methods and apparatus for performance optimization of short channel and/or short gate length metal-oxide-semiconductor field effect transistors (MOSFETs) on fully depleted semiconductor-on-insulator (FDSOI) substrates via simultaneously optimizing the semiconductor active layer thickness ($L_{Si}$), the channel doping concentration ($N_{CH}$), the buried oxide thickness ($L_{BOX}$), and the BOX dielectric constant ($κ_{BOX}$). Throughout this disclosure the term "BOX" is used to indicate a buried insulating structure including one or more layers of material (not necessarily including an oxide) that forms a part of a semiconductor-on-insulator substrate hereinafter designated SOI. Also, while the substrate is usually composed of single crystal material, such as silicon, other materials may be used and, accordingly, the region on which the BOX is situated is referred to herein as "substrate material" and may include anything that operates as a support for the BOX. It will be understood that channel layers described herein are formed of single crystal semiconductor material such as silicon, germanium or other semiconductor materials.

Figure 1:
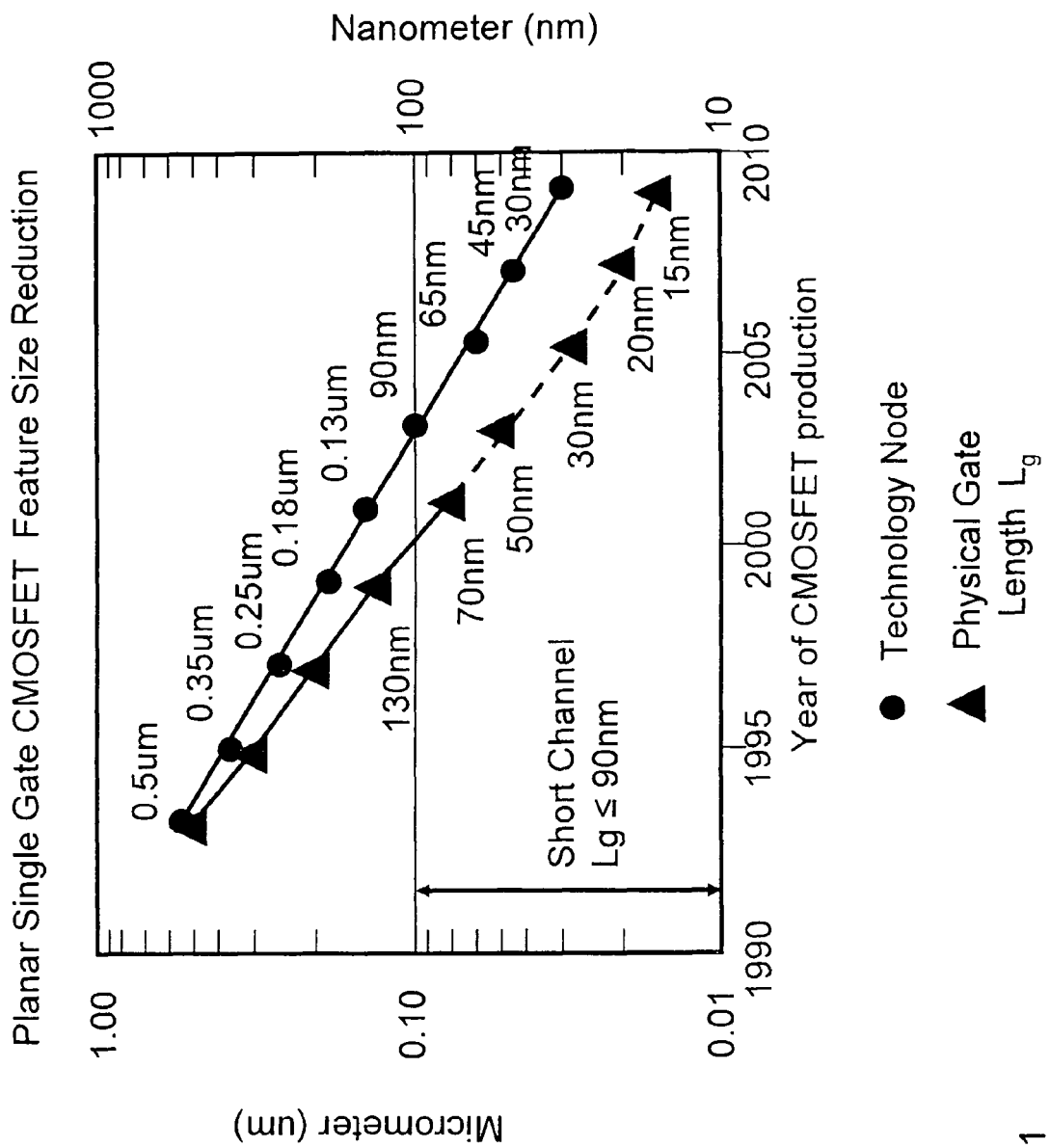
FIG. 1 is a graph illustrating actual and projected CMOSFET length scale and gate length required as a function of technology generation and or year.
Figure 2:
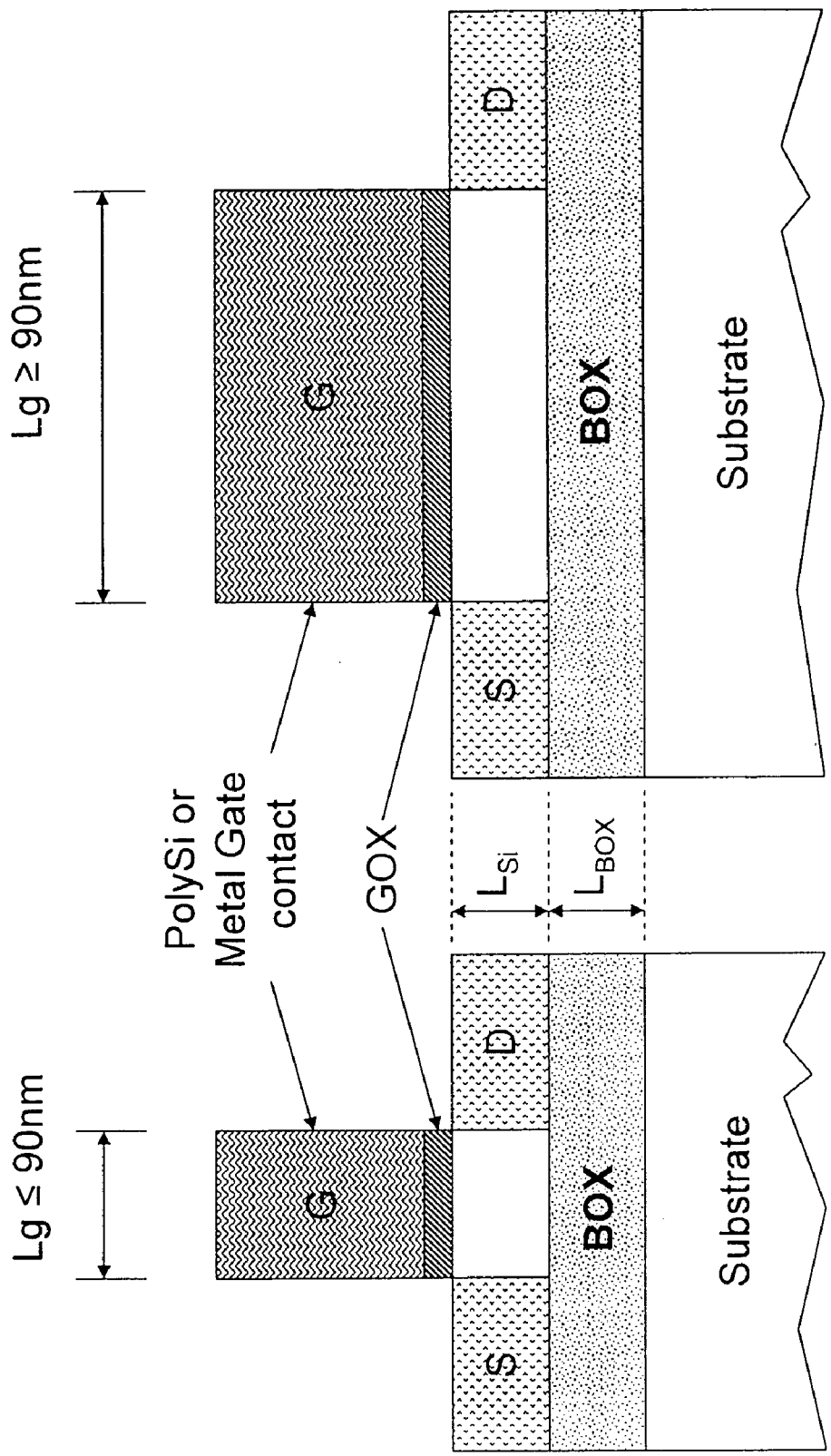
FIG. 2A illustrates a planar single gate FDSOI MOSFET structure with short gate length.
FIG. 2B illustrates a planar single gate FDSOI MOSFET structure with long gate length.
Figure 3:
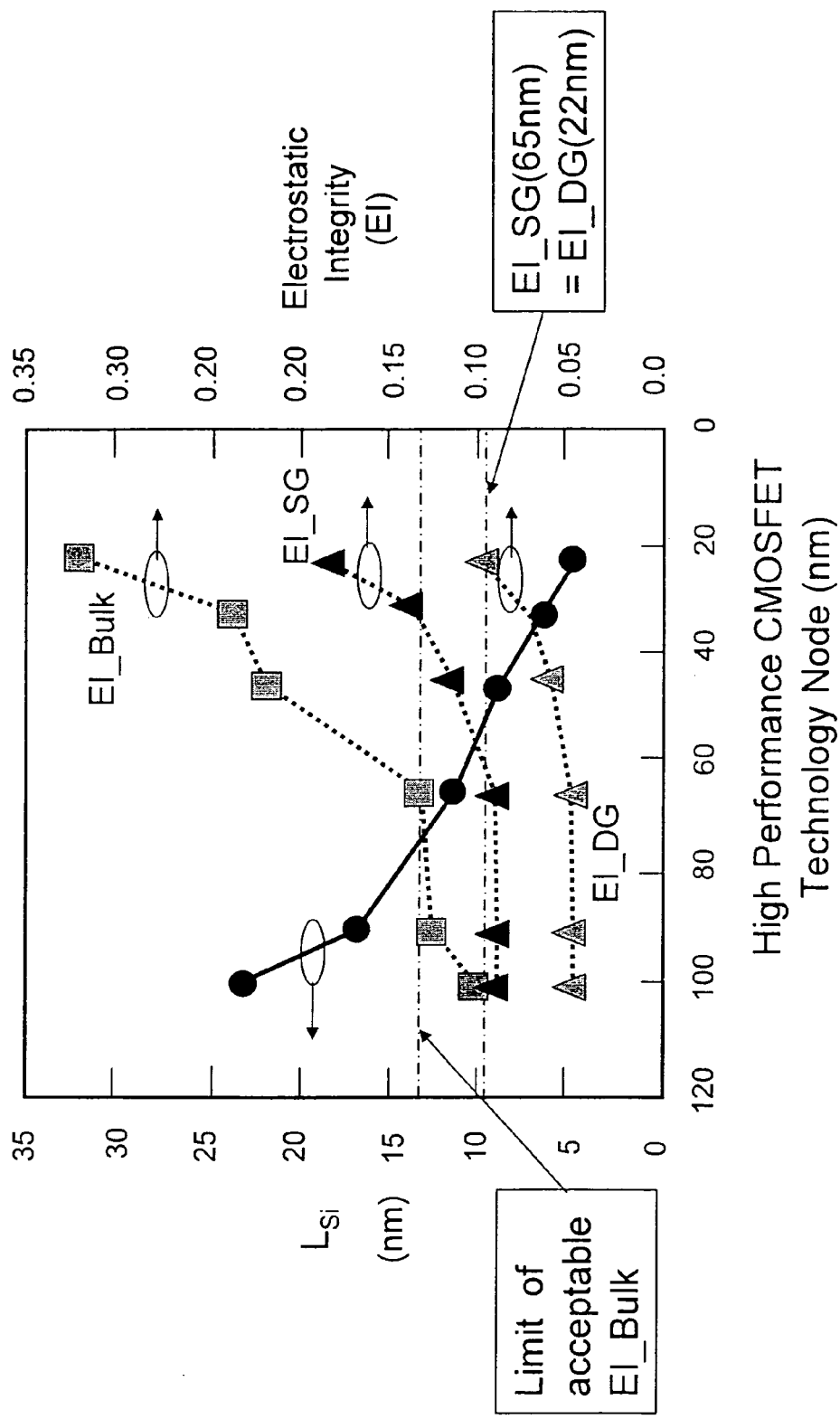
FIG. 3 is a graph illustrating electrostatic integrity versus technology nodes for bulk-Si, single-gate FDSOI, and double-gate FDSOI MOSFETs.
Figure 4:
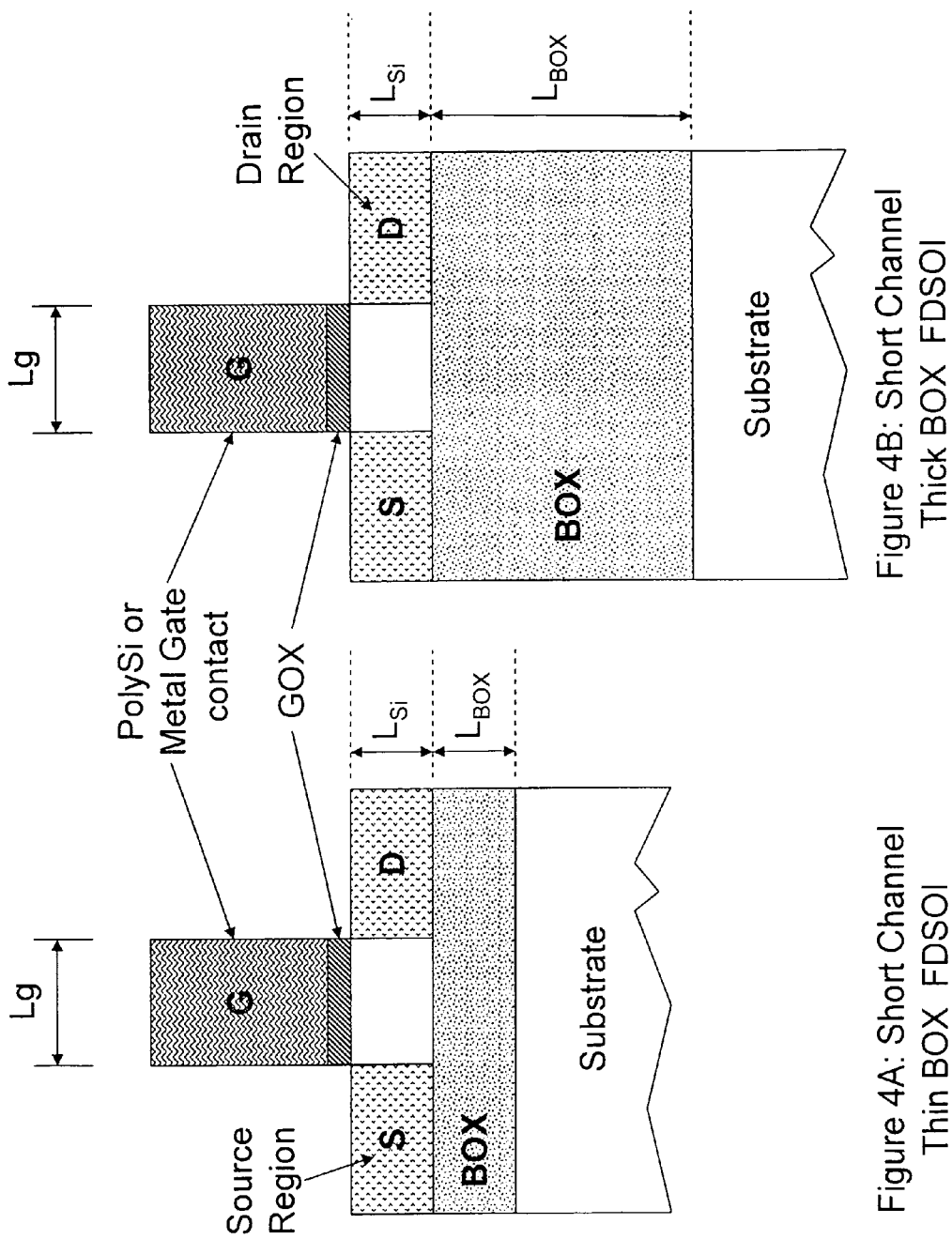
FIG. 4A illustrates a short channel thin box FDSOI.
FIG. 4B illustrates a short channel thick box FDSOI.

Turning now to FIG. 4, two types of short channel ($L_g \leq 90$ nm) FDSOI FETs using thin ($L_{BOX} \leq 50$ nm) and thick ($L_{BOX} \geq 50$ nm) BOX layers are illustrated. The source/drain regions, gate oxide and gate stack are otherwise identical. Conventional SOI fabrication technologies, such as SIMOX and wafer bonding (See FIGS. 23 and 24), can be used to fabricate BOX layers beneath thin single crystal Si active layer using any of $SiO_2$, $SiO_xN_y$, $Si_3N_4$, or combinations thereof. It is well known, that $SiO_2$ can form very low interface trap density with Si and has a lower dielectric constant (κ=3.9) than $Si_3N_4$ (κ=6.8-7.5), depending on stoichiometry.

The use of high-κ gate oxides in short channel devices imposes further design criteria on the choice of the dielectric constant of the BOX. For ultrathin FDSOI channel layers ($L_{Si}$) and short channels or gates ($L_g$), the electric field between the gate and BOX are coupled through the active layer. The ratio of the gate oxide capacitance ($C_{GOX}$) to the BOX capacitance ($C_{BOX}$) provides a measure of the strength of control that the top gate has relative to the BOX acting as a back or lower gate. $C_{GOX}/C_{BOX} = (\epsilon_{GOX} L_{BOX})/(\epsilon_{BOX} L_{GOX})$. For a single gate FDSOI FET, the body factor (BF) can be defined as $BF = 1 + (C_{CH-BG}/C_{G-CH})$, where $C_{CH-BG}$ is the capacitance between the channel and the back gate and/or the substrate and $C_{G-CH}$ is the capacitance between the top-gate and the channel. The body factor is a measure of the coupling between the gate voltage and the channel. Depending on the device bias configuration, $C_{G-CH}$ is the lumped representation of the gate-to-channel capacitance and/or the presence of a surface inversion channel. Similarly, $C_{G-CH}$ represents the lumped capacitance that prevents the potential in the channel from being controlled by the upper gate voltage. In an inversion mode FDSOI device, the channel is at the top or bottom portion of the Si active layer. In an accumulation mode device, the Si body current flows wholly within the Si active layer with depth distribution controlled by the back-gate voltage.

Therefore, a single gate FDSOI device generally has four modes of operation:

(i) $C_{G-CH} = C_{GOX}$ and $C_{CH-BG} = C_{SOI} C_{BOX}/(C_{SOI} + C_{BOX})$;

(ii) $C_{G-CH} = C_{GOX}$ and $C_{CH-BG} = C_{SOI} = \epsilon_{SOI}/L_{Si}$;

(iii) $C_{G-CH} = C_{GOX} C_{SOI}/(C_{GOX} + C_{SOI})$ and $C_{CH-BG} = C_{BOX}$; and (iv) $C_{G-CH} = C_{GOX} C_{SOI}/(C_{GOX} + C_{SOI})$ and $C_{CH-BG} = C_{SC2} C_{BOX}/(C_{SC2} + C_{BOX})$ where $C_{SC2}$ is the interface surface charge.

Clearly, the single gate has the greatest coupling to the BOX for all BOX thicknesses considered. The calculation uses $SiO_2$ for the gate oxide and the BOX and a heavily doped Si substrate, and can be thought of as a grounded BOX. The significance of the body factor is used as a figure of merit to quantify how well the gate controls the channel relative to the BOX. For reference, typical PDSOI planar single gate devices exhibit body factors in a range of approximately 1.3 to 1.5. For equivalent gate lengths, the single gate FDSOI body factor is considerably lower than a single gate PDSOI, however, the merit of the double gate is evident, due to a larger coupling between the gates and the channel.

Typically, the GOX and BOX material compositions have been fixed at $SiO_2$ and/or $Si_xN_y$. That is, the difference in dielectric constant between the GOX and the BOX has been the same if not zero. The present disclosure further considers vastly different dielectric constant materials in the GOX and the BOX layers. For example, the introduction of a high-κ (e.g., $κ(HfO_2) \sim 22$) GOX layer coupled to a FDSOI will markedly alter the body factor if $κ(GOX) = κ(BOX)$. If however, a high-κ material is used in the BOX and in the GOX (i.e., $κ(GOX) = κ(BOX)$) the body factor will be essentially the same as for the conventional case of $κ(GOX) = κ(BOX) = κ(SiO_2)$.

As device gate lengths scale below $L_g \leq 90$ nm, various short channel effects become an issue for CMOSFET performance. In particular, the well known drain-induced-barrier-lowering (DIBL), severely influences the drain potential on the channel region and deleteriously impacts the operation of short channel MOS transistors. The effect is similar to the well known punch-through effect. In the weak inversion regime there is a potential barrier between the source and the channel regions. The height of this barrier is a result of the balance between drift and diffusion currents between these two regions. If a high drain voltage is applied, the barrier height can decrease, leading to an increased drain current.

Figure 5:
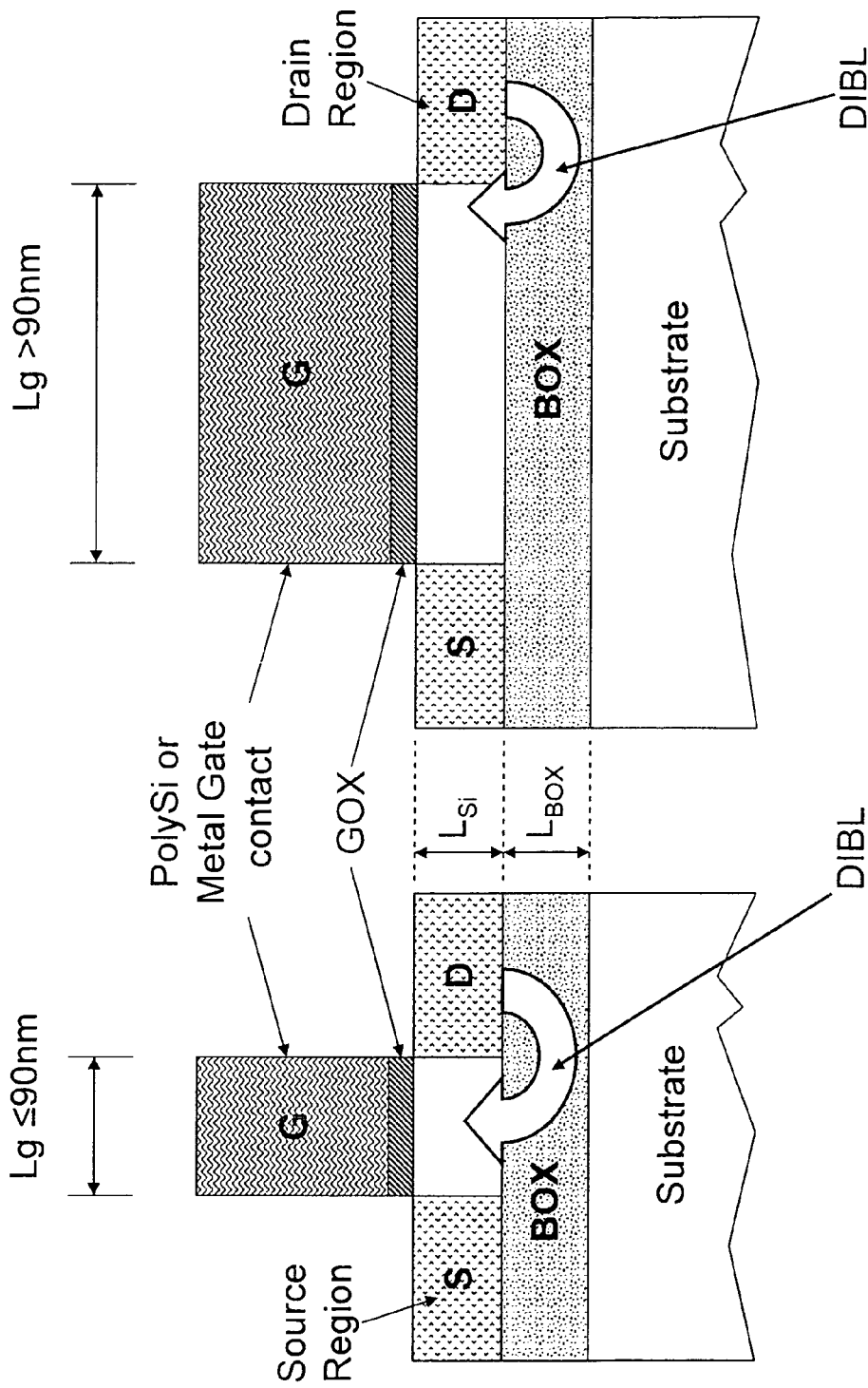
FIG. 5A illustrates drain-induced-barrier-lowering (DIBL) effects in a short channel FDSOI MOSFET.
FIG. 5B illustrates drain-induced-barrier-lowering (DIBL) effects in a long channel FDSOI MOSFET.
Figure 6:
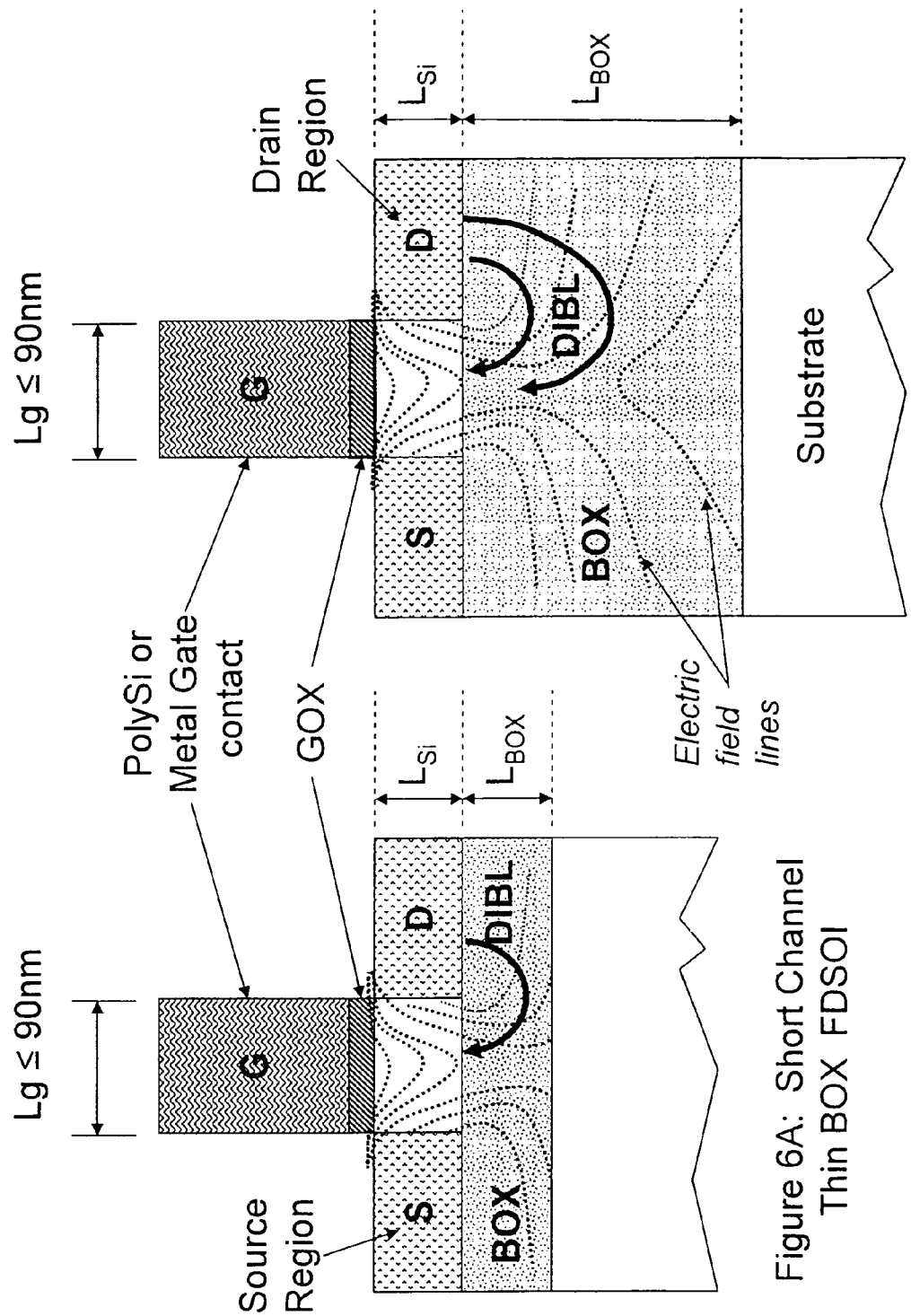
FIG. 6A illustrates two-dimensional electric field fringing in a short channel FDSOI MOSFET with a thin BOX layer.
FIG. 6B illustrates two-dimensional electric field fringing in a short channel FDSOI MOSFET with a thick BOX layer.

The effect of DIBL for short and long channel planar single gate FDSOT devices is illustrated in FIGS. 5A and 5B, respectively. The effect of DIBL is relatively more pronounced in short channel devices compared to long channel devices. Quantifiable effects are discussed later in this disclosure. The underlying process responsible for DIBL is related to the BOX electric field fringing effect, shown in FIG. 6. The electric field lines shown in FIGS. 6A and 6B are for the case of short channel FDSOI devices using thin and thick BOXs, respectively. In these examples the GOX and channel or active layers are assumed to be $SiO_2$ and Si, respectively. The dielectric material is assumed to be the same for thin and thick BOXs. Note, the GOX layer thickness is substantially thinner than the BOX layer for the case of a single gate FDSOI MOSFET.

The electric field fringing in the BOX, as illustrated in FIGS. 6A and 6B, clearly shows that the electric field fringing in the BOX is reduced using a thin BOX and therefore exhibits a lower DIBL effect. Physically, because of the thick BOX in conventional SOIs ($L_{BOX} \sim 100\text{-}400$ nm), the electric field that emanates from the source/drain (S/D) junction depletion charge tends to terminate in the SOI body/channel, thus augmenting the normal short channel effects (SCEs) due to the 2-D effects in the SOI body and increasing the subthreshold. Based on this physical insight, a direct way to suppress the field fringing is to scale, or thin the BOX. However, for nanoscale gate lengths substantial thinning of the BOX is required e.g., $t_{BOX}$<25 nm. Such aggressive scaling of the BOX to circumvent the SCEs, increases the channel to BOX capacitance which directly impacts CMOSFET speed. The breakdown of the simple $L_{Si}$ scaling with $L_g$ can however be recovered by scaling $L_{BOX}$ from thick regimes of 100 nm to the thin regimes less than 10 nm. The hole mobility is also known to degrade in FDSOI CMOSFETs (where $L_{Si}$=3.7-50 nm) using a thick BOX (1350 Å). The hole degradation is believed to result from the surface roughness scatter and spatial confinement in the channel. This negatively impacts pMOS devices and effects circuit performance. A potential solution is to reduce the spatial confinement by reducing the dielectric constant of the BOX and thus reduce interface scatter at the channel-BOX interface.

Therefore, a thin BOX FDSOI is preferable for reducing SCEs, however, increased body effect (e.g., BOX capacitance) results. The increase in BOX capacitance can be effectively reduced by incorporating a lower dielectric material in the BOX relative to the GOX. For example, if GOX material is $SiO_2$ and/or $SiO_xN_y$, then a BOX layer using fluorinated $SiO_2$ (FSG) is preferred. This can be incorporated as part of the wafer bonding procedure.

Figure 7:
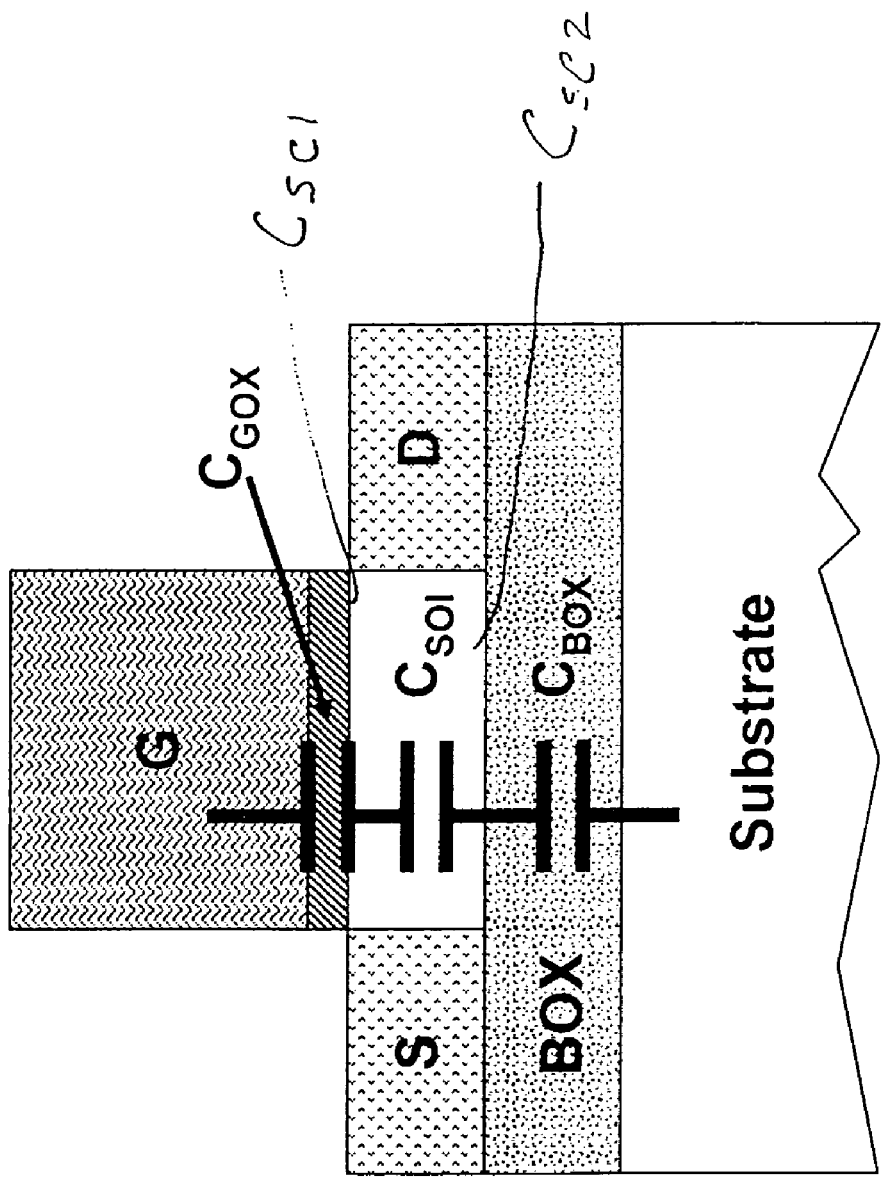
FIG. 7 illustrates an equivalent capacitance circuit for a planar single gate FDSOI MOSFET.

Referring to FIG. 7, the equivalent capacitance circuit for a FDSOI MOSFET is illustrated. In FIG. 7 and the following discussion, $C_{GOX}$=gate oxide capacitance, $C_{SOI}$=Si layer or active layer capacitance, and $C_{BOX}$=buried oxide/insulator (BOX) capacitance.

Figure 8:
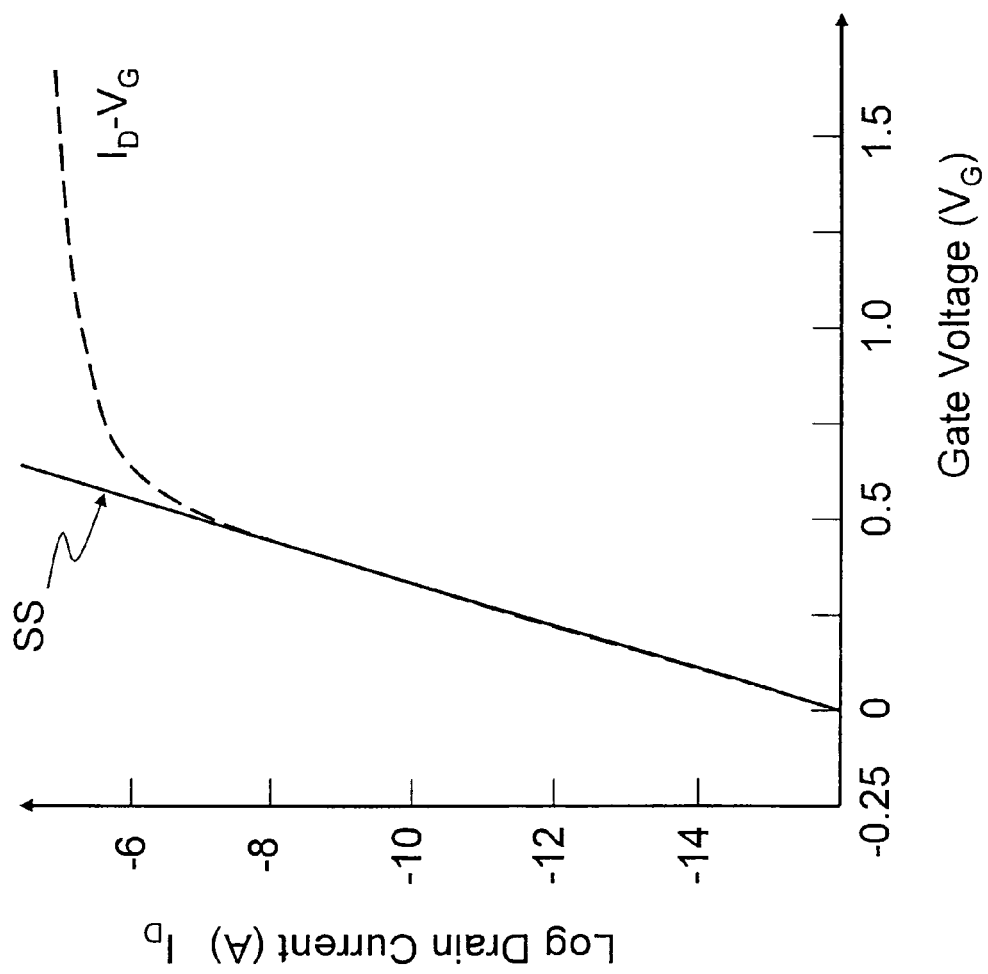
FIG. 8 is a graph showing a typical drain current versus gate voltage transfer curve for a planar single gate FDSOI MOSFET.

Referring additionally to FIG. 8, a typical drain current ($I_D$) versus gate voltage ($V_G$) transfer curve is illustrated for a planar single gate FDSOI MOSFET. An important parameter characterizing FDSOI devices is the subthreshold slope or swing (SS), calculated from the inverse slope of the subthreshold drain current ($I_D$) versus gate voltage ($V_G$), given by: $SS=d[V_G]/d[\log(I_D)]$. Referring to FIG. 8, the subthreshold slope is defined as the slope of the curve below the threshold voltage.

Typically, the threshold current of a CMOSFET is independent of drain voltage and due primarily to a carrier diffusion process. FIG. 7 depicts schematically the equivalent circuit of a FDSOI structure, and can be approximated in terms of gate capacitance $C_{GOX}$, channel capacitance $C_{SOI}$, and BOX capacitance $C_{BOX}$. The surface charges at the gate oxide and Si channel interface, and the surface charges at the Si channel and the BOX interface are denoted as $C_{SC1}$ and $C_{SC2}$, respectively. It can be shown that the subthreshold slope is well approximated by the relation: $SS=k_B T q^{-1} \ln(10) \{\alpha - \Gamma/\beta\}$: where $\alpha = 1+(C_{SC1}+C_{SOI})/C_{GOX}$; $\beta = 1+(C_{SC2}+C_{SOI})/C_{BOX}$; and $\Gamma = C_{SOI}(C_{GOX}C_{BOX})^{-1}$.

In a planar single gate FDSOI MOSFET, the substrate or region beneath the BOX may also be used to bias the BOX so as to form an electrical back-gate. The GOX is biased via the gate contact and referred to as the front-gate. Using the back-gate, the FDSOI device can be operated in the subthreshold regime in either an enhancement-mode n-channel device (electron carriers) and/or an accumulation-mode p-channel device (hole carriers0. In the subthreshold regime, the back-gate may be used to control various spatial regions within the device, namely: (i) the GOX-SOI surface inversion channel; (ii) the SOI-BOX inversion channel; (iii) the SOI channel current primarily disposed in a plane spatially closer to the GOX; and (iv) SOI channel current primarily disposed in a plane spatially closer to the BOX.

The lower limit of SS will be given by: $SS_L = k_B T q^{-1} \ln(10) 1+\lambda$: where $\lambda = (C_{SOI}C_{BOX})\{C_{GOX}(C_{SOI}+C_{BOX})\}^{-1}$ The upper limit of SS will be given by large and negative and positive back-gate bias such that accumulation and inversion occur at the interface between the channel and BOX and is approximately given by: $SS_H = k_B T q^{-1} \ln(10)\{1+\theta\}$:

where $\theta = C_{BOX}(C_{SOI}+C_{GOX})\{C_{SOI}C_{BOX}\}^{-1}$.

Figure 9:
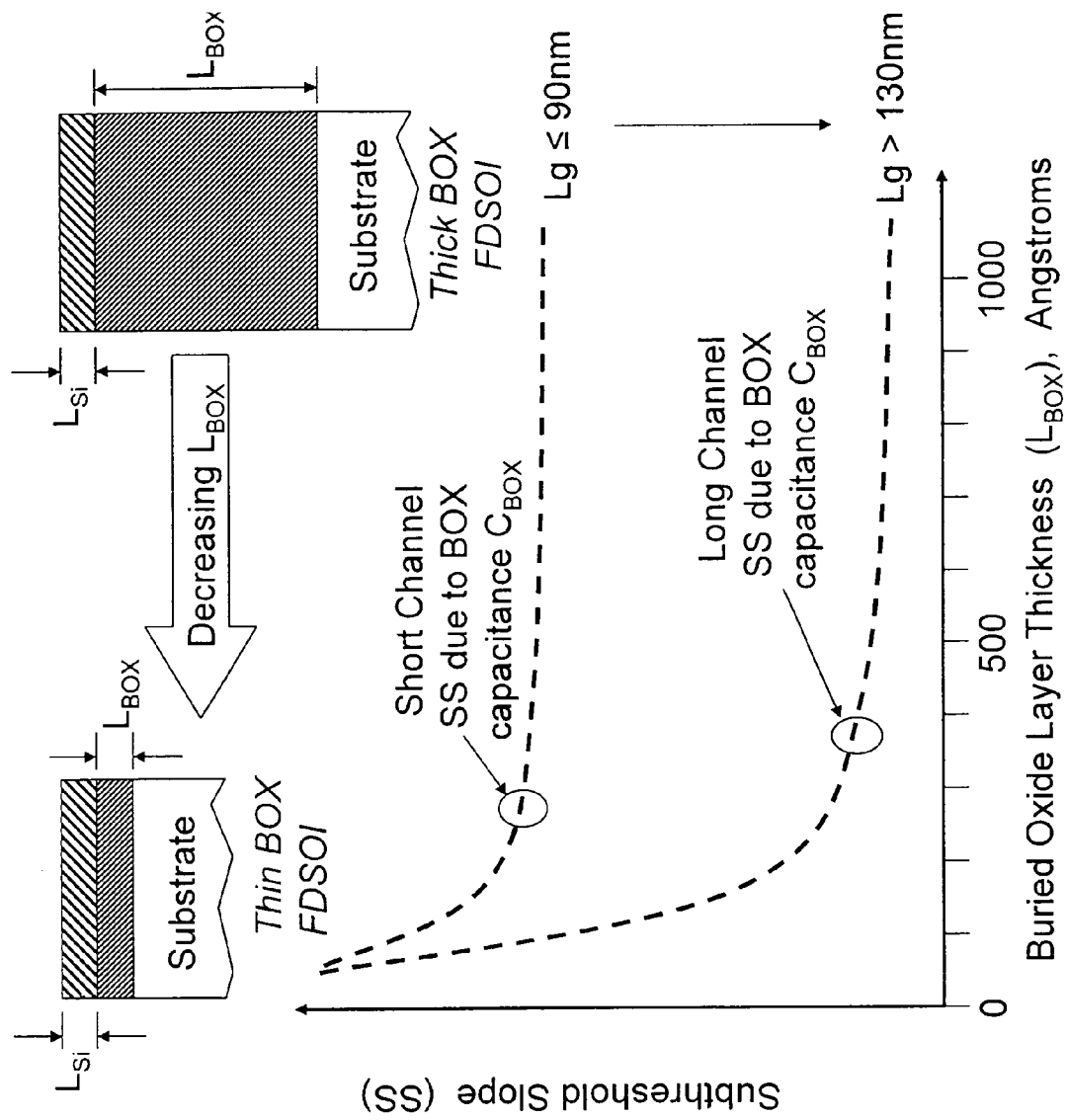
FIG. 9 is a graph showing subthreshold slope (SS) versus BOX layer thickness for the case of long and short channel FDSOI MOSFETs.

Turning to FIG. 9, the effect on SS by varying LBOX and, thus, $C_{BOX}$ (since $C_{BOX} = \epsilon_{BOX}/L_{BOX}$) for the case of a homogeneous dielectric constant $\epsilon_{BOX}$ layer. Curves representing SS versus $L_{BOX}$ for various gate length device regimes, namely long ($L_g$>90 nm) and short ($L_g \leq 90$ nm) are shown. The FDSOI Si channel layer thickness $L_{Si}$ is fixed. The SS in short channel devices is larger than for the case of long channel devices for all $L_{BOX}$ values considered. This may be a disadvantage for short channel FDSOI devices, but another competing effect which tends to reduce the SS in short channel devices must be considered. The DIBL associated with the BOX, described previously, via the 2-D electric field fringing through the BOX into the channel can be adequately described by $$DIBL_{BOX} = a\{(\epsilon_{SOI}/\epsilon_{GOX})L_i^{-2}[1+(L_{SOI}/L_i)^2] L_{GOX}\{L_{SOI}+3L_{BOX}(L_i-L_{SOI})(L_i-L_{SOI}+3L_{BOX})^{-1}V_{dd}\} + \gamma \Delta DIBL_{BOX}$$

Where the thick BOX correction factor is given by:

$\Delta DIBL_{BOX} = V_{dd} L_i^{-3} [L_{GOX}L_{Si} (L_{Si}+3L_{BOX})2-L_i^2]^{0.5}$ and $DIBL_{BOX} \to 0$ for a thin BOX. Li is the length of the electric field line and is underestimated by assuming it is equal to the gate length $L_g$.

Figure 10:
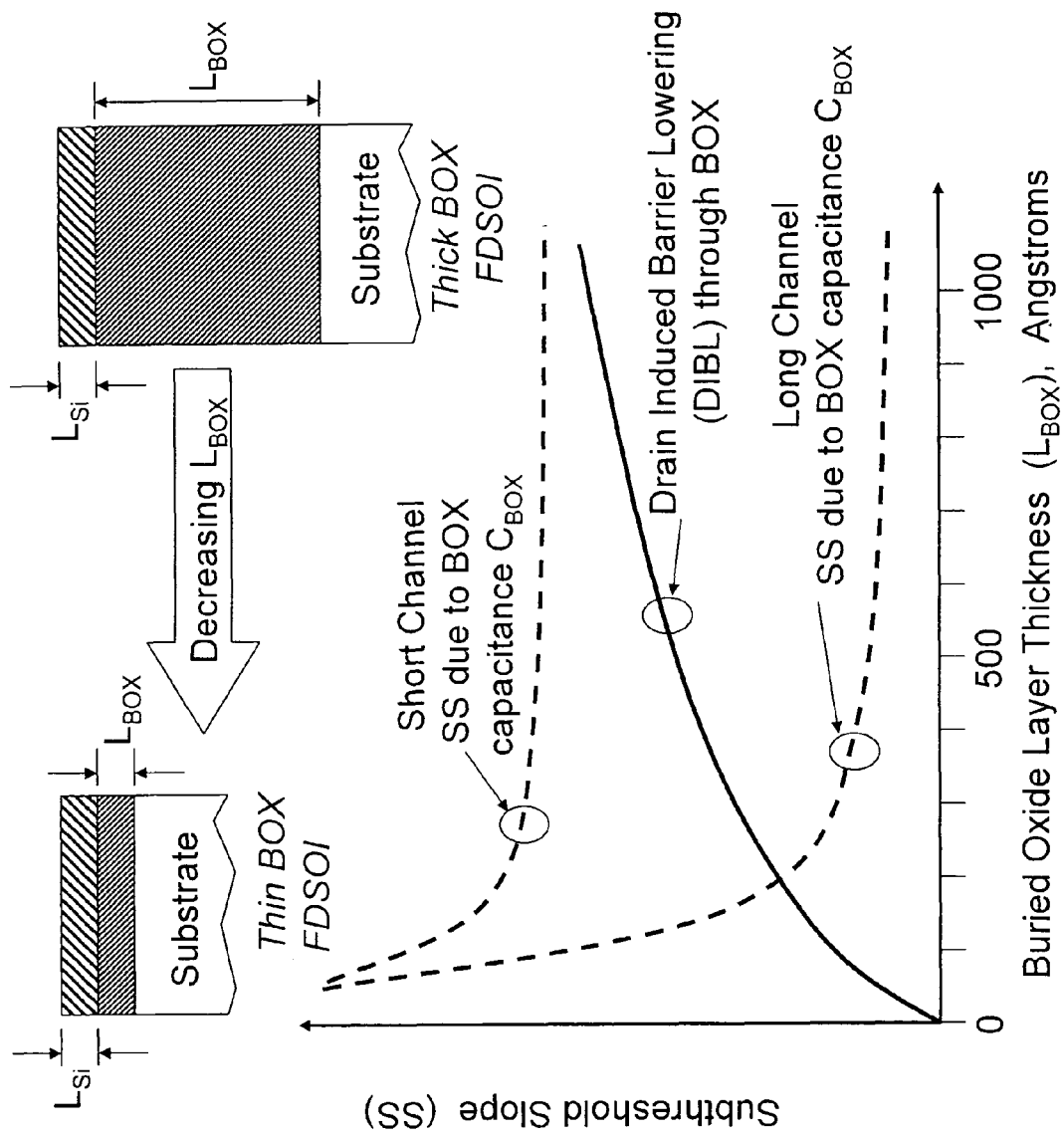
FIG. 10 is a graph showing the subthreshold slope versus $L_{BOX}$ with superimposed competing effect due to DIBL through the BOX layer.
Figure 11:
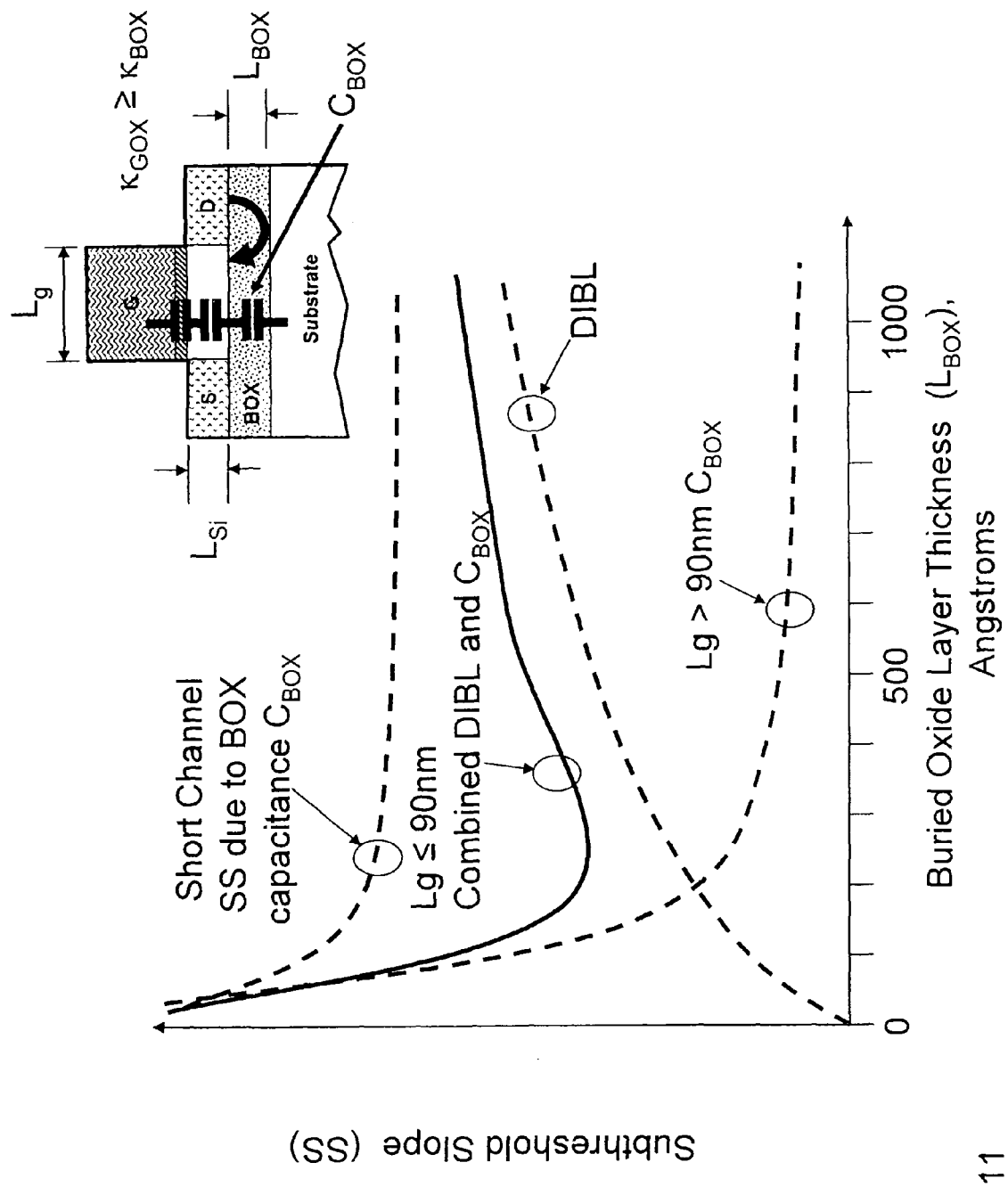
FIG. 11 is a graph showing the combined effect of $C_{BOX}$ and $DIBL_{BOX}$ on the subthreshold slope versus $L_{BOX}$ for short channel FDSOI MOSFETS.

Turning now to FIG. 10, a comparison is shown of trends in SS due to the $C_{BOX}$ via $L_{BOX}$, and the DIBL effect through the BOX layer as a function of $L_{BOX}$. Clearly, the influence of $C_{BOX}$ and $DIBL_{BOX}$ counteract each other in the thin BOX regime (i.e., $L_{BOX}$<500 Å). The magnitude of $DIBL_{BOX}$ is reduced dramatically for the thin BOX regime. The total SS versus $L_{BOX}$ characteristic is the combination of effects due to $C_{BOX}$ and $DIBL_{BOX}$. Referring additionally to FIG. 11, the combined effect on SS resulting in a local minimum SS for thin BOX regimes is shown. All CMOSFET parameters other than $L_{BOX}$ are equivalent. For the case of the GOX dielectric constant material being made from 65 nm technology node $SiO_XN_Y$ and the BOX layer being made from lower dielectric constant material, such as fluorinated silicon dioxide ($F:SiO_2$), the SS is minimized by choice of optimal $L_{BOX}$~200-250 Å.

Figure 12:
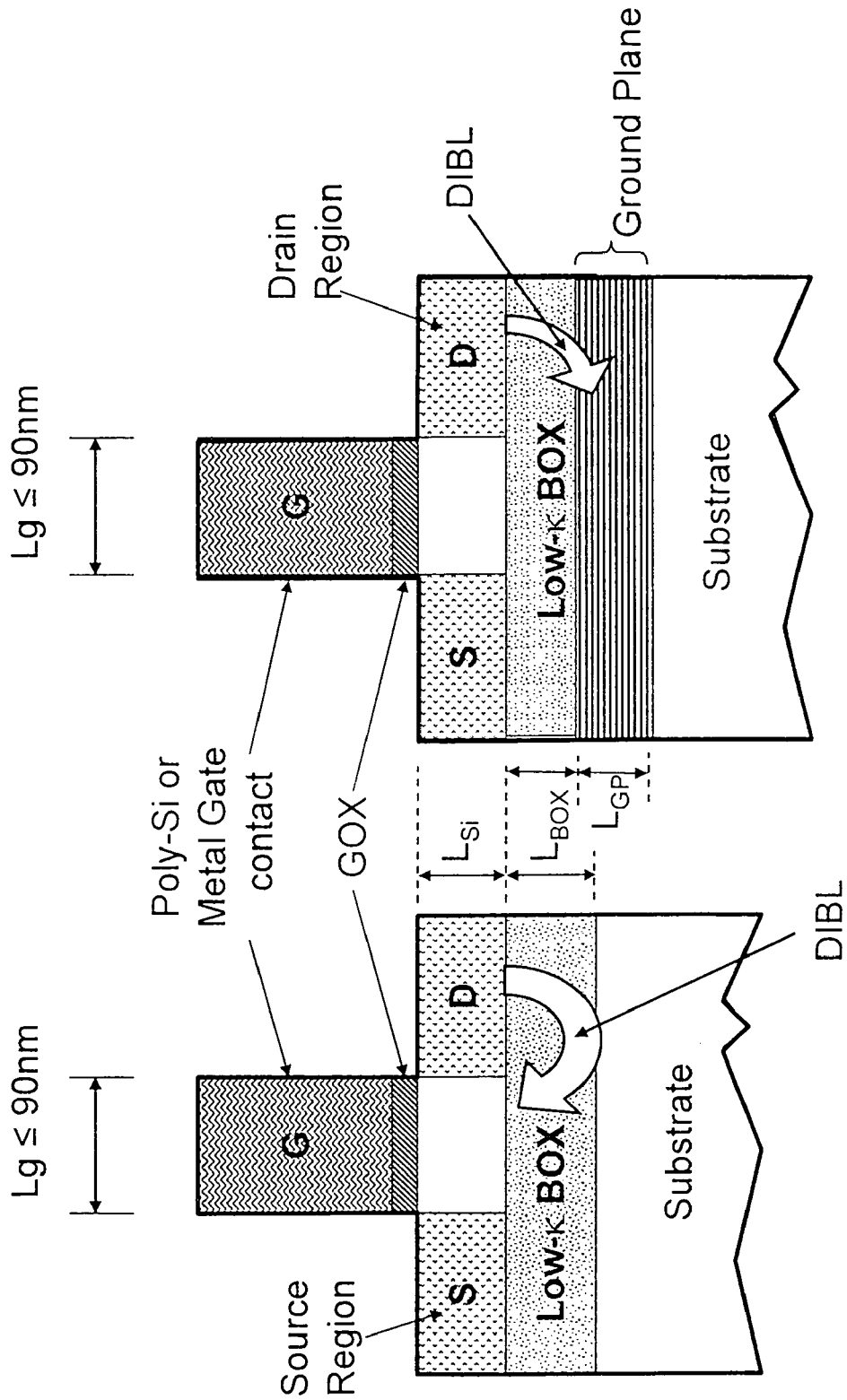
FIG. 12A illustrates the $DIBL_{BOX}$ in a thin BOX FDSOI device with no ground plane.
FIG. 12B illustrates the reduction of $DIBL_{BOX}$ in a thin BOX FDSOI device with ground plane.

Advantageous termination of the electric field lines (as shown in FIGS. 6A and 6B) penetrating the BOX is possible by positioning a highly conductive doped semiconductor layer and/or ground plane immediately beneath the BOX and between the BOX and the substrate, as shown in FIG. 12B. The effect of the electric field terminating ground plane is to further advantageously reduce $DIBL_{BOX}$ for an otherwise equivalent $L_{BOX}$. The electric field effect for no ground plane and for a ground plane is illustrated in FIGS. 12A and 12B, respectively.

Figure 13:
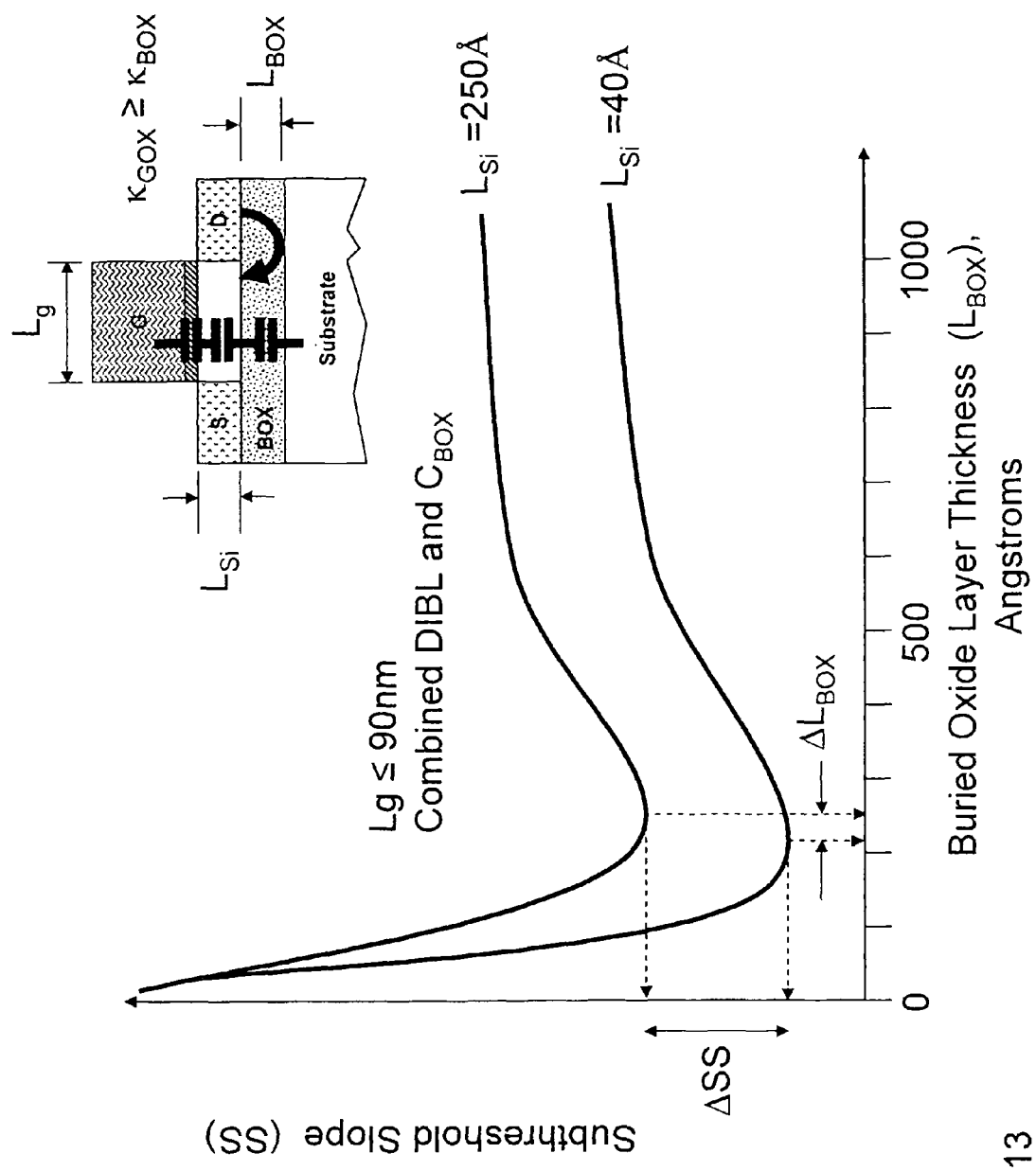
FIG. 13 is a graph showing the subthreshold slope versus $L_{BOX}$ for a single gate short channel FDSOI device.

The effect of the active layer thickness in the thin BOX short channel FDSOI device is also an important parameter influencing the SS for a given BOX configuration. Referring to FIG. 13, a graph shows the reduction in SS for a planar single gate short channel ($L_g$<90 nm) FDSOI device by reducing $L_{Si}$ from 250 Å to 40 Å, while keeping all other parameters constant. The optimal $L_{BOX}$ required for minimum SS, generally shifts to lower $L_{BOX}$ values for thinner $L_{Si}$. However, the slope of the SS versus $L_{BOX}$ curve to the left hand side of the $L_{BOX}$ minimum increases faster for smaller $L_{Si}$. This results in increased sensitivity to BOX thickness fluctuations $\Delta L_{BOX}$-Conventional manufacturing tolerances for $\Delta L_{Si}$ and $\Delta L_{BOX}$ thickness fluctuations are of the order ±5 nm using layer transfer and or wafer bonding techniques and chemical mechanical polishing (CMP). Furthermore, active layer atomic cleaving techniques using hydrogen implantation introduces large residual H-atom density in the active layer. This residual hydrogen concentration typically peaks at the active layer-BOX interface resulting in deleterious electrically active defects, potentially affecting long term device reliability and increasing $C_{SC2}$ beyond acceptable levels.

One solution offered by the present invention is to alleviate the sensitivity of $\Delta L_{BOX}$ on SS by increasing the physical BOX thickness required but keeping the equivalent BOX thickness (EOT) necessary for minimizing SS. This can be achieved by introducing a lower dielectric constant insulator material immediately beneath the active layer. The thickness of the low-κ BOX layer is determined by the relation given in FIG. 16, which will be described in more detail presently.

Figure 14:
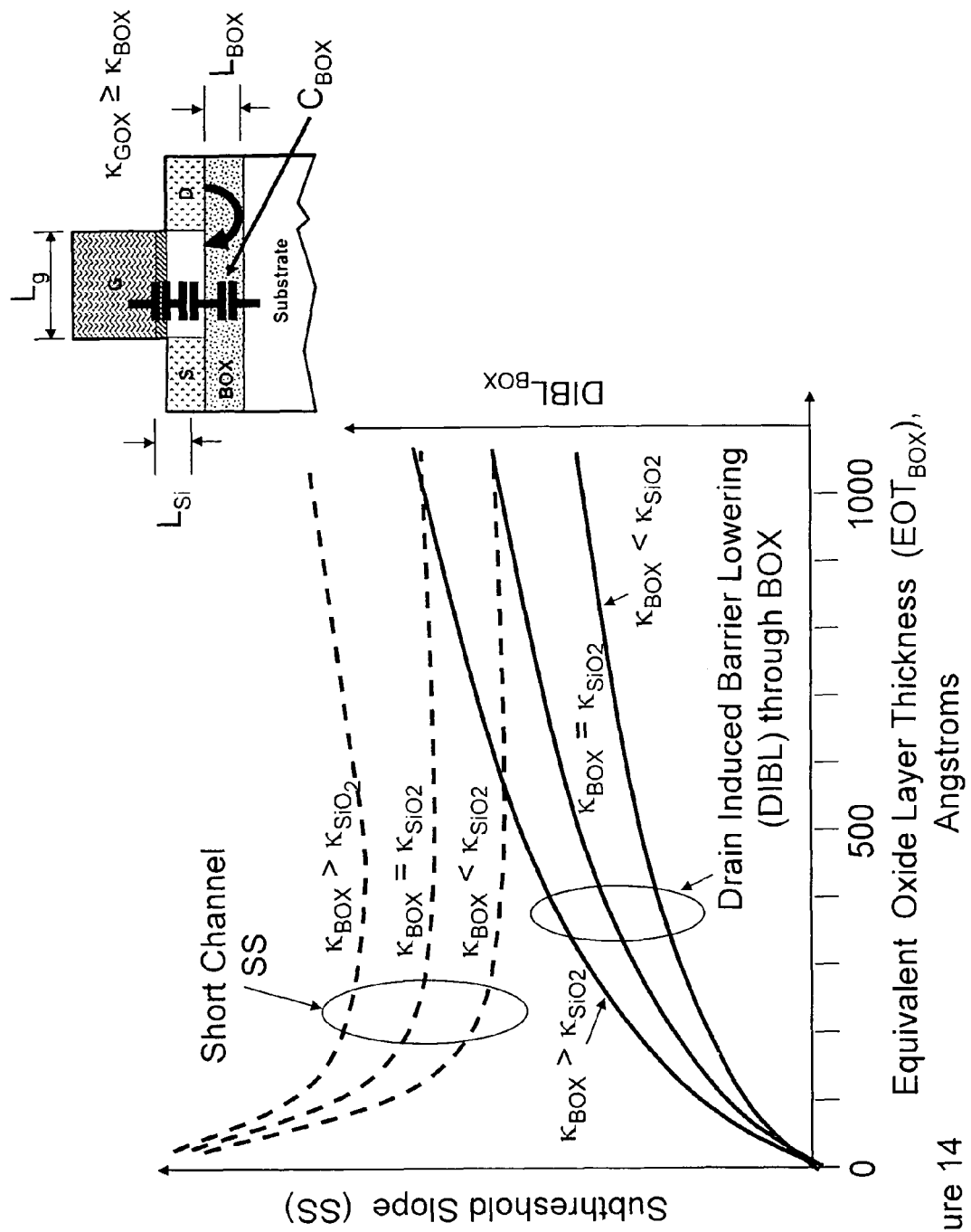
FIG. 14 is a graph showing the short channel FDSOI subthreshold slope versus the equivalent oxide thickness (EOT) of the BOX due to CBOX and $DIBL_{BOX}$ for various dielectric constant BOX compositions.

Using stoichiometric $SiO_2$ as the reference dielectric and/or insulator material, the behavior of the SS due to $C_{BOX}$ and $DIBL_{BOX}$ are plotted as a function of $L_{BOX}$ in FIG. 14. The short channel ($L_g$=20 nm) FDSOI device is configured with a conventional GOX layer of $SiO_2$ and a Si active layer ($L_{Si}$=100 Å). The effect of reducing and increasing the dielectric constant of the BOX layer relative to $SiO_2$ is shown in the curves of FIG. 14. Increasing $\kappa(BOX)>\kappa(SiO_2)$ results in an increase in the SS and $DIBL_{BOX}$ for all $L_{BOX}$ studied, due to an effective reduction in the equivalent oxide thickness of the BOX. Conversely, decreasing $\kappa(BOX)<\kappa(SiO_2)$ results in an overall decrease in the SS and $DIBL_{BOX}$ for all $L_{BOX}$ studied, due to an effective increase in the equivalent oxide thickness of the BOX. The net benefit of lowest SS is therefore obtained using a Low-κ BOX material, so that the SS is minimized beyond values attained using $SiO_2$.

Referring additionally to FIG. 15, the effect of using a high-κ and low-κ BOX in a short channel FDSOI device is illustrated. As can be seen in FIG. 15, the 2-D electric field fringing effect is enhanced in the high-κ BOX case compared to an otherwise identical device using a low-κ BOX. Conversely, the 2-D electric field fringing effect is reduced in the low-κ BOX case compared to an otherwise identical device using a high-κ BOX. The net effect of using a low-κ BOX is to further reduce the $DIBL_{BOX}$ effect. Conversely, the net effect of using a high-κ BOX is to further increase the $DIBL_{BOX}$ effect. Therefore, the present invention teaches that the use of a complete and/or partial low-κ BOX layer is advantageous for increasing the short channel FDSOI performance and alleviating manufacturing tolerances of the SOI substrate structure.

Referring now to FIG. 16, a relation is shown between the equivalent oxide thickness (EOT) and the physical oxide thickness ($L_{BOX}$) compared to reference material $SiO_2$. Clearly, EOT is reduced using high-κ insulator and/or dielectric material. Conversely, EOT is increased using low-κ insulator and/or dielectric material. The implication being that if a high-κ BOX is used it must be constructed physically thicker than an equivalent optimal $L_{BOX}$ using $SiO_2$.

Referring additionally to FIGS. 17 and 18, two implementations or embodiments are shown of different multilayer BOX structures composed of different dielectric constant materials. From the preceding explanation it is taught that the low-κ BOX is advantageous for use beneath the channel. This technique is further used in the following example wherein a low-κ layer forms only a portion of the total multilayered BOX. Further, it is disclosed that the low-κ layer is preferably positioned immediately beneath the active channel layer, thereby separating the active channel from the remaining BOX layers.

More specifically, FIG. 17 shows an example of an implementation in accordance with the present invention using a multilayered high-κ and low-κ structure forming a general capacitive device for purposes of explanation. It will be understood that the multilayered BOX structures of FIGS. 17 and 18 are designed and constructed for use in a semiconductor device, such as a short channel FDSOI MOSFET. If the low-κ layer is positioned immediately beneath or adjacent the channel layer, the EOT will be dominated by the low-κ portion of the BOX. The advantage of this technique is that a high-κ BOX layer can be used with a relatively thin low-κ layer. Furthermore, one or more low-κ layers, and high-κ layers if desired, can be disposed in the multilayer BOX. For example, FIG. 18 illustrates two low-κ layers, one disposed immediately adjacent the channel layer and a second one disposed immediately adjacent the substrate material, with a relatively higher dielectric region sandwiched between the two low-κ layers. Here it should be understood that the thickness of the low-κ layers do not need to be equivalent.

One embodiment in accordance with the present invention, illustrated in FIG. 19, is implemented by way of example in a short channel FDSOI MOSFET. In this embodiment a BOX 30 is positioned between substrate material 32 and an active layer 34. BOX 30 includes a single low-κ layer 36, positioned immediately below or adjacent active layer 34, and a layer 38 of relatively higher dielectric constant material positioned on or adjacent substrate material 32. A source region 40 and a drain region 42 are formed in spaced apart relation ship in active layer 34 with the spacing therebetween defining a channel region 44. A gate insulator (generally a gate oxide, GOX) layer 46 is positioned above channel region 44 and a gate stack 48 (including a metal gate contact) is positioned on gate insulator layer 46 to form a planar FDSOI MOSFET.

Another embodiment in accordance with the present invention, illustrated in FIG. 20, is also implemented by way of example in a short channel FDSOI MOSFET. In this embodiment similar components are designated with similar numbers and have a prime (') added to indicate the different embodiment. The difference between the embodiment illustrated in FIG. 19 and the embodiment illustrated in FIG. 20 is the construction of the BOX. BOX 30' includes a low-κ layer 36', positioned immediately below or adjacent active layer 34', and a layer 38' of relatively higher dielectric constant material positioned immediately beneath low-κ layer 36'. In this embodiment, another low-κ layer 39' is positioned between relatively high-κ layer 38' and substrate material 32'. It should be understood by those skilled in the art that additional layers of material with different dielectric constants could be included in BOX 30 or 30' to provide additional or different characteristics.

Turning to FIGS. 21A and 21B, two additional embodiments according to the present invention are depicted in short channel FDSOI MOSFETs. In these embodiments the thickness of the high-κ layer is adjusted to alter the EOT. The implication mentioned in conjunction with FIG. 16 above is included in these embodiments to demonstrate variations of layer thicknesses.

In the embodiment illustrated in FIG. 21A, a BOX 50 is positioned between substrate material 52 and an active layer 54. BOX 50 includes a single low-κ layer 56, positioned immediately below or adjacent active layer 54, and a layer 58 of relatively higher dielectric constant material positioned on or adjacent substrate material 52. A source region 60 and a drain region 62 are formed in spaced apart relation ship in active layer 54 with the spacing therebetween defining a channel region 64. A gate insulator (generally a gate oxide, GOX) layer 66 is positioned above channel region 64 and a gate stack 68 (including a metal gate contact) is positioned on gate insulator layer 66 to form a planar FDSOI MOSFET. The equivalent oxide thickness (EOT) for the thin BOX 50 is shown by double headed arrow 70.

The other embodiment in accordance with the present invention, illustrated in FIG. 21B, is also implemented by way of example in a short channel FDSOI MOSFET. In this embodiment similar components are designated with similar numbers and have a prime (') added to indicate the different embodiment. The difference between the embodiment illustrated in FIG. 21A and the embodiment illustrated in FIG. 21B is the construction of the BOX. In FIG. 21B, layer 58' of relatively higher dielectric constant material is much thicker than layer 58 of FIG. 21A. The equivalent oxide thickness (EOT) for the thick BOX 50' is shown by double headed arrow 70'. Thus, the EOT can be varied by varying the thickness of one or more of the multilayers in the BOX with the results explained above.

Some exemplary candidate materials that exhibit lower dielectric constants than $SiO_2$ are tabulated in the chart of FIG. 22. As can be seen from the candidate materials, the dielectric constant can be significantly reduced below that of $SiO_2$ (κ=3.9) down to potentially an air gap (κ=1).

Turning now to FIG. 23, an epitaxial growth method in accordance with the present invention is illustrated for fabricating or manufacturing some or all of the embodiments disclosed. This method uses single crystal rare-earth oxides, rare-earth oxynitrides, and/or rare earth oxyphosphides that are epitaxially deposited in single crystal and single phase structures on a substrate. The rare earth materials and methods are explained in more detail in one or more of the following copending United States Patent Applications, United States Patent Publications, and U.S. patent Ser. Nos. 09/924,392; 10/666,897; 10/746,957; 10/825,912; 10/825,974; 11/025,363; 11/025,681; U.S. Pub. 2005/0166834; U.S. Pub. 2005/0161773; U.S. Pub. 2005/0163692; 11/054,573; 11/054,627; 11/253,525; 11/254,031; U.S. Pat. No. 7,018,484; and U.S. Pat. No. 7,037,806 pertinent portions of each included herein by reference.

In this method, the rare-earth based layer constitutes an insulator and/or dielectric function. A single crystal semiconductor is then deposited upon the insulator and/or dielectric thereby forming an epitaxial SOI structure. As explained in one or more of the above described documents, the rare earth material is deposited on the single crystal substrate material in single crystal form so that the single crystal semiconductor can be epitaxially grown thereon. As shown in FIG. 23, the rare earth oxide layer is preferably deposited with a spatially dependent oxygen concentration as a function of the growth direction. The oxygen concentration can be varied to be in excess or deficient so as to produce a variable stoichiometry rare-earth oxide layer. In one example, the oxygen excess region is chosen to reside in a region substantially disposed away from the substrate and channel layers. That is, the central region of the rare-earth oxide is oxygen rich with chemical formula $REO_{1.5+y}$, $0 \leq y \leq 1$, where RE=rare earth chosen from the lanthanide series and O=oxygen. The regions immediately beneath the active semiconductor layer and optionally above the substrate are chosen to exhibit oxygen deficient chemical formula $REO_{1.5-y}$, $0 \leq y \leq 1$. The epitaxial structure, including semiconductor-on-insulator, deposited on a substrate can then be optionally annealed and/or implanted with oxygen species so as to affect the formation of a lower dielectric constant layer or region immediately beneath the top-most semiconductor active layer.

Conversely, the epitaxial structure can be realized with oxygen rich regions substantially at the beginning and end of the rare-earth oxide layer deposition with the interior portion of the RE oxide substantially oxygen deficient. The epitaxial structure consisting of semiconductor-on-insulator, deposited on a substrate can then be optionally annealed and/or implanted with oxygen species so as to affect the formation of a lower dielectric constant layer or region immediately beneath the top-most semiconductor active layer.

Turning to FIG. 24, a process is illustrated for the formation of a low-κ BOX using wafer bonding techniques. A preferred embodiment is the use of two single crystal silicon substrates, designated 241 and 242. A low-κ dielectric layer 243 is deposited on the surface of silicon substrate 241. Low-κ dielectric layer 243 can, for example, be formed by first forming/depositing high quality $SiO_2$ followed by a fluorine ion implantation and/or fluorine chemistry plasma immersion techniques. The $SiO_2$ layer 243 is transformed into a fluorinated $SiO_2$ ($F:SiO_2$) composition with lower dielectric constant than the initial $SiO_2$ layer. Second silicon substrate 242 is optionally protected by a conventional $SiO_2$ layer. Next, second substrate 242 is implanted with hydrogen and/or helium atoms, designated 244, to the required density and depth so as to enable a blistering process for mechanical separation of bulk silicon substrate from the required silicon film 245. Substrates 241 and 242 are then bonded together, with the exposed surface of silicon film 245 bonded to the exposed surface of fluorinated $SiO_2$ layer 243, so as to attain intimate mechanical contact free from contamination and particulate matter at the junction or interface. The bonded structure is then annealed so as to activate atomic bonding between substrates 241 and 242. An optionally separate anneal may be performed to initiate the blistering of the implanted atoms (or it may be initiated during the first anneal), thereby providing the separation of thin film 245 from the remaining bulk silicon of substrate 242. The completed structure is then polished using CMP or multiple silicon oxidation and etch steps to reduce and polish the ultrathin silicon active layer 245 to the required thickness (40 Å≦$L_{Si}$≦250 Å) suitable for formation of semiconductor devices, such as FDSOI MOSFET or CMOSFETs. The completed structure, designated 246, is thus a FDSOI multilayer structure including a low-κ BOX, due to the F:SiO$_2$ region. The BOX may optionally be composed of multilayer dielectric regions as disclosed above.

Thus, a new and improved SOI substrate for fully depleted small channel devices is disclosed along with methods of manufacture. The SOI substrate includes a multilayer BOX with different numbers of layers in which the dielectric constant and the thickness of the various layers can be specifically designed to increase performance of the manufactured devices and alleviate manufacturing tolerances.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A fully depleted MOSFET comprising:
   an SOI structure including a single crystal substrate material, a BOX positioned on the substrate material, and a single crystal active layer epitaxially grown on the BOX;
   the BOX including a first insulating layer of single crystal rare earth insulator material with a first dielectric constant and a first thickness and a second insulating layer having a second dielectric constant different than the first dielectric constant and a second thickness different than the first thickness;
   drain and source regions formed in the single crystal active layer so as to be separated by a fully depleted channel region in the single crystal active layer; and
   a gate insulating layer overlying the channel region and a gate stack positioned on the gate insulating layer,
   wherein the second insulating layer is formed between the first insulating layer and the single crystal active layer after the epitaxial growth of the single crystal active layer, and the second insulating layer comprises at least silicon and oxygen; and
   wherein the first insulating layer is derived from a single crystal layer formed of a rare earth oxide material ReO$_x$, which, before the epitaxial growth of the single crystal active layer, comprises an oxygen concentration gradient with at least one region along the thickness direction having a peak oxygen concentration with x being:

$$1.5 < x \leq 2.5.$$

2. A fully depleted MOSFET as claimed in claim 1 wherein the channel region is less than 90 nm long.

3. A fully depleted MOSFET as claimed in claim 1 wherein the first dielectric constant is higher than the second dielectric constant.

4. A fully depleted MOSFET as claimed in claim 3 wherein the thickness of the first layer of material is greater than the thickness of the second layer of material.

5. A fully depleted MOSFET as claimed in claim 1 wherein the single crystal substrate material includes silicon.

* * * * *